(12) United States Patent
Kondo

(10) Patent No.: US 10,014,354 B2
(45) Date of Patent: Jul. 3, 2018

(54) ORGANIC EL ELEMENT, ORGANIC EL DISPLAY PANEL USING SAME, AND ORGANIC EL DISPLAY PANEL MANUFACTURING METHOD

(71) Applicants: JOLED INC., Tokyo (JP); JAPAN DISPLAY INC., Tokyo (JP)

(72) Inventor: Tetsuro Kondo, Tokyo (JP)

(73) Assignees: JOLED INC., Tokyo (JP); JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 15/252,463

(22) Filed: Aug. 31, 2016

(65) Prior Publication Data

US 2017/0069696 A1 Mar. 9, 2017

(30) Foreign Application Priority Data

Sep. 7, 2015 (JP) ................................. 2015-175758

(51) Int. Cl.
*H01L 27/32* (2006.01)
*H01L 51/52* (2006.01)
*H01L 51/56* (2006.01)
*H01L 27/12* (2006.01)

(52) U.S. Cl.
CPC ...... *H01L 27/3246* (2013.01); *H01L 27/1218* (2013.01); *H01L 27/3248* (2013.01); *H01L 27/3272* (2013.01); *H01L 27/3274* (2013.01); *H01L 27/3276* (2013.01);
(Continued)

(58) Field of Classification Search
CPC ............. H01L 27/3246; H01L 27/3272; H01L 51/5271; H01L 51/56
See application file for complete search history.

(56) References Cited

U.S. PATENT DOCUMENTS 5,443,922 A 8/1995 Nishizaki et al.
8,003,417 B2 * 8/2011 Li ........................ H01L 27/3244
257/98
8,884,849 B2 11/2014 Masuda
(Continued)

FOREIGN PATENT DOCUMENTS

JP 05-163488 6/1993
JP 2008-176291 7/2008
(Continued)

*Primary Examiner* — Sophia Nguyen
(74) *Attorney, Agent, or Firm* — Greenblum & Bernstein, P.L.C.

(57) ABSTRACT

An organic EL display panel in which pixels are arranged in a matrix, including: light-emitting layers disposed above pixel electrode layers in intervals between adjacent ones of column banks; an opposing electrode layer disposed above the light-emitting layers, the opposing electrode layer including a light-transmissive material; column light-shielding layers disposed higher than the pixel electrode layers, extending in the column direction, arranged side-by-side in the row direction, and overlapping row-direction edge portions of the pixel electrode layers in plan view of a substrate; and row light-shielding layers disposed higher than the pixel electrode layers, extending in the row direction, arranged side-by-side in the column direction, overlapping column-direction edge portions of the pixel electrode layers and partially overlapping contact regions in plan view of the substrate.

11 Claims, 14 Drawing Sheets

(52) U.S. Cl.
CPC ...... *H01L 27/3297* (2013.01); *H01L 51/5271* (2013.01); *H01L 51/56* (2013.01); *H01L 27/3258* (2013.01)

(56) References Cited

U.S. PATENT DOCUMENTS

| | | | |
|---|---|---|---|
| 8,907,341 B2 | 12/2014 | Kanegae et al. | |
| 8,952,365 B2* | 2/2015 | Nishiyama | C23C 14/083 |
| | | | 257/40 |
| 9,006,758 B2* | 4/2015 | Yoneda | H01L 33/24 |
| | | | 257/89 |
| 9,081,141 B2 | 7/2015 | Tsukamoto et al. | |
| 9,224,956 B2* | 12/2015 | Kawanami | F04B 37/14 |
| 9,231,036 B2* | 1/2016 | Oooka | H01L 51/525 |
| 9,246,138 B2* | 1/2016 | Nishiyama | C23C 14/083 |
| 9,620,560 B2* | 4/2017 | Isobe | H01L 51/5234 |
| 9,722,006 B2* | 8/2017 | Nishimura | H01L 51/5209 |
| 9,761,638 B2* | 9/2017 | Komatsu | H01L 27/3213 |
| 2006/0139254 A1* | 6/2006 | Hayakawa | G09G 3/3216 |
| | | | 345/76 |
| 2007/0200488 A1* | 8/2007 | Ito | F21K 2/06 |
| | | | 313/500 |
| 2008/0024701 A1* | 1/2008 | Abe | G02F 1/133512 |
| | | | 349/110 |
| 2008/0150421 A1* | 6/2008 | Takata | H01L 27/3244 |
| | | | 313/504 |
| 2008/0231778 A1* | 9/2008 | Tsao | G02F 1/133516 |
| | | | 349/106 |
| 2009/0109143 A1* | 4/2009 | Yamazaki | H01L 51/0003 |
| | | | 345/76 |
| 2009/0174923 A1* | 7/2009 | Nozawa | H01L 27/3244 |
| | | | 359/245 |
| 2011/0108859 A1* | 5/2011 | Oosako | H01L 27/3246 |
| | | | 257/88 |
| 2012/0299116 A1* | 11/2012 | Takeuchi | G02F 1/13624 |
| | | | 257/390 |
| 2013/0126839 A1* | 5/2013 | Matsushima | H01L 27/3246 |
| | | | 257/40 |
| 2013/0234126 A1* | 9/2013 | Nakatani | H01L 27/3246 |
| | | | 257/40 |
| 2013/0234129 A1* | 9/2013 | Yamada | H01L 51/5265 |
| | | | 257/40 |
| 2014/0102877 A1* | 4/2014 | Yamazaki | C30B 23/005 |
| | | | 204/192.15 |
| 2014/0127846 A1* | 5/2014 | Yamada | H01L 51/5088 |
| | | | 438/46 |
| 2014/0151709 A1* | 6/2014 | Nishiyama | H01L 27/3211 |
| | | | 257/72 |
| 2014/0284572 A1* | 9/2014 | Oooka | H01L 51/525 |
| | | | 257/40 |
| 2014/0312329 A1* | 10/2014 | Fujii | H01L 51/5228 |
| | | | 257/40 |
| 2014/0367675 A1 | 12/2014 | Tsukamoto et al. | |
| 2015/0041813 A1* | 2/2015 | Kim | H01L 27/124 |
| | | | 257/59 |
| 2015/0060827 A1* | 3/2015 | Sasaki | H01L 51/5284 |
| | | | 257/40 |
| 2015/0090991 A1* | 4/2015 | Ishii | H01L 51/525 |
| | | | 257/40 |
| 2015/0155347 A1* | 6/2015 | Baek | H01L 27/3272 |
| | | | 257/40 |
| 2015/0226990 A1* | 8/2015 | Miyazaki | G02F 1/1339 |
| | | | 349/123 |
| 2016/0078828 A1* | 3/2016 | Tamaki | G09G 3/3607 |
| | | | 345/690 |
| 2016/0133675 A1* | 5/2016 | Yata | H01L 27/3218 |
| | | | 257/89 |
| 2016/0181336 A1* | 6/2016 | Tokuda | H04N 9/30 |
| | | | 257/40 |
| 2016/0211311 A1* | 7/2016 | Sato | H01L 27/3272 |
| 2016/0293676 A1* | 10/2016 | Komatsu | G02B 5/20 |
| 2016/0321982 A1* | 11/2016 | Lee | G09G 3/3607 |
| 2016/0322437 A1* | 11/2016 | Sakamoto | H01L 27/3246 |
| 2017/0033314 A1* | 2/2017 | Matsusue | H01L 51/5092 |
| 2017/0047381 A1* | 2/2017 | Takata | H01L 51/50 |
| 2017/0069696 A1* | 3/2017 | Kondo | H01L 27/3246 |
| 2017/0076654 A1* | 3/2017 | Wang | G09G 3/2074 |
| 2017/0117339 A1* | 4/2017 | Takata | H01L 51/50 |
| 2017/0207417 A1* | 7/2017 | Ikeda | H01L 51/5253 |

FOREIGN PATENT DOCUMENTS

| | | |
|---|---|---|
| JP | 2013-165014 | 8/2013 |
| JP | 2015-050059 | 3/2015 |
| JP | 2015-072827 | 4/2015 |
| WO | 2013/108783 | 7/2013 |

* cited by examiner

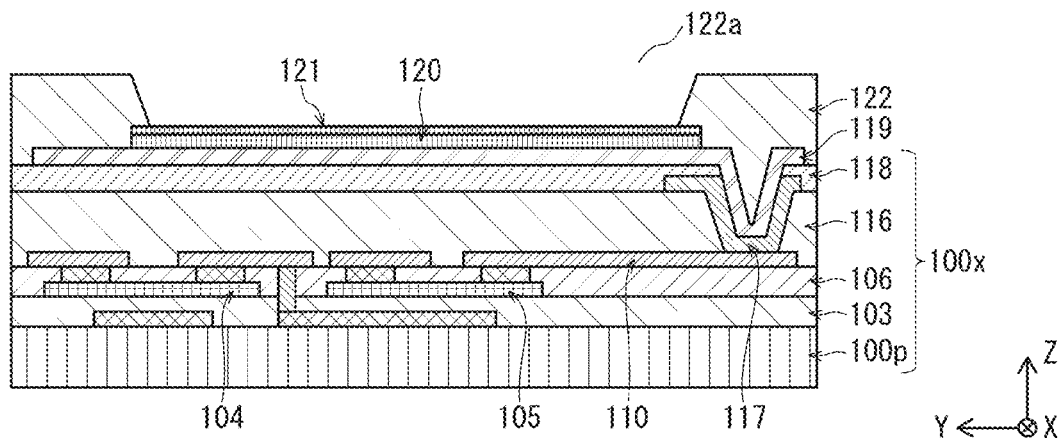
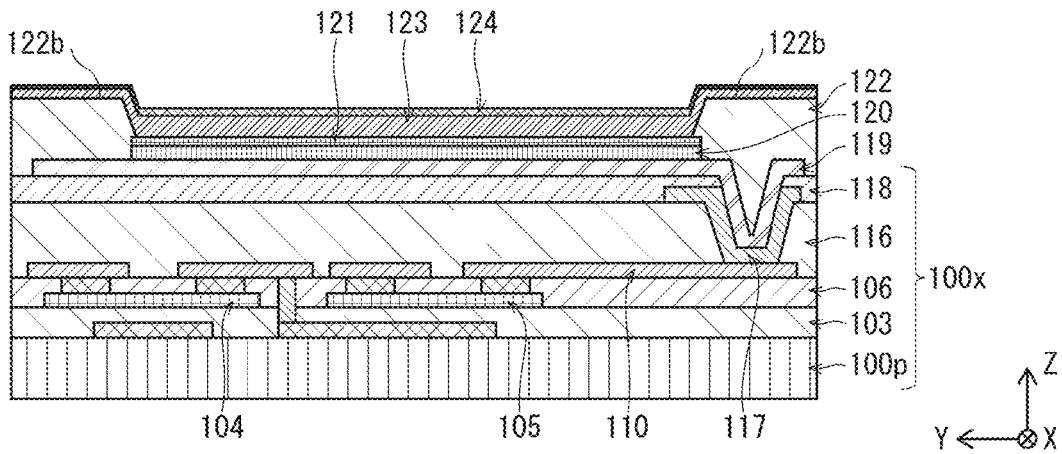
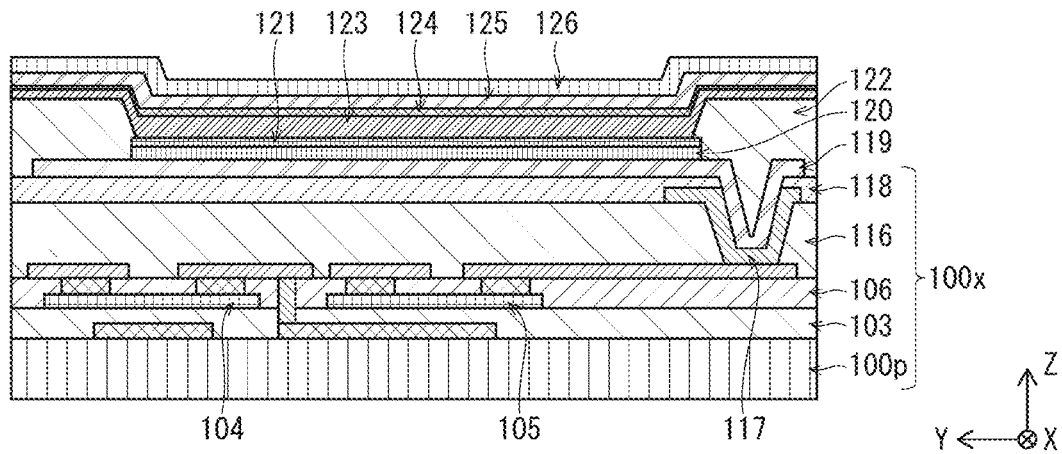

ORGANIC EL ELEMENT, ORGANIC EL DISPLAY PANEL USING SAME, AND ORGANIC EL DISPLAY PANEL MANUFACTURING METHOD

CROSS-REFERENCE TO RELATED APPLICATION

This application is based on application No. 2015-175758 filed in Japan, the contents of which are hereby incorporated by reference.

BACKGROUND OF THE DISCLOSURE (1) Technical Field

The present disclosure relates to organic electroluminescence (EL) elements that use electroluminescence of organic material, organic EL display panels that use the organic EL elements, and organic EL display panel manufacturing methods.

(2) Description of Related Art

In recent years, as display panels used in display devices such as digital televisions, organic EL display panels are being implemented in which a plurality of organic EL elements are arrayed in a matrix on a substrate. Such organic EL display panels have high visibility, because each organic EL element is self-luminous.

In an organic EL display panel, each organic EL element typically has a structure in which a light-emitting layer that includes an organic light-emitting material is disposed between an anode and cathode pair of electrodes. When driven, a voltage is applied between the pair of electrodes, holes are injected to the light-emitting layer from the anode, electrons are injected to the light-emitting layer from the cathode, and the holes and the electrons recombine to emit light.

In the organic EL display panel, light-emitting layers are typically separated from adjacent organic EL elements by banks composed of an insulative material. In an organic EL display panel for color display, such organic EL elements form RGB color pixels, one pixel in a color display being formed by a combination of adjacent RGB pixels.

Typically, in an organic EL display panel, in order to prevent leaking of light between adjacent pixels and mixing of colors of light associated with this, a lattice-shaped light-shielding layer is provided above the banks at boundaries between adjacent pixels. For example, WO 2013108783 discloses an organic EL element that suppresses a decrease in aperture ratio while also preventing color mixing between adjacent pixels, by using a matrix-shaped light-shielding member that has different thicknesses above a color filter substrate. Further, JP 2015-72827 discloses an organic EL display device that has an element substrate on which a light-emitting layer and a light-shielding member are disposed, and has a color filter layer that includes colored layers of multiple colors and an inter-pixel light-shielding member between colored layers. The light-shielding member is disposed more centrally in each pixel than the inter-pixel light-shielding member and thereby suppresses parallax mixed color due to light leakage to adjacent pixels and obtains high light extraction efficiency.

SUMMARY OF THE DISCLOSURE (1) Problems to be Solved

However, as resolution of a display panel is increased, element area for each pixel is reduced, but width of a shielding layer required to prevent light leakage to adjacent pixels is maintained regardless of reduction in element area. Thus, as resolution increases, aperture ratio of the shielding layer decreases, and a reduction in light emission efficiency based on a reduction in light emission area per pixel area becomes a technical problem. In contrast, when reducing the shielding layer in order to increase aperture ratio, there is a concern that display contrast decreases due to glare from external light reflected from reflective electrodes of the display panel.

In view of the above, the present disclosure aims to provide an organic EL element that improves suppression of glare from external light on a display surface and improves light emission efficiency, an organic EL display panel using the organic EL element, and a method of manufacturing the organic EL display panel.

(2) Means for Solving the Problems

In order to achieve this aim, an organic EL display panel pertaining to one aspect of the technology described in the present disclosure is an organic EL display panel in which a plurality of pixels are arranged in a row direction and a column direction in a matrix, the organic EL display panel including: a substrate; a plurality of pixel electrode layers arranged in the row direction and the column direction in a matrix on the substrate, the pixel electrode layers including a light-reflective material; a plurality of column banks disposed on the substrate and on the pixel electrode layers, covering row-direction edge portions of the pixel electrode layers, extending in the column direction, arranged side-by-side in the row direction, and defining row-direction edges of self-luminous regions of the pixels; a plurality of row banks disposed on the substrate and on the pixel electrode layers, covering column-direction edge portions of the pixel electrode layers and contact regions of the pixel electrode layers that are for electrically connecting the pixel electrode layers, extending in the row direction, arranged side-by-side in the column direction, and defining column-direction edges of the self-luminous regions; a plurality of light-emitting layers disposed above the pixel electrode layers in intervals between adjacent ones of the column banks; an opposing electrode layer disposed above the light-emitting layers, the opposing electrode layer including a light-transmissive material; a plurality of column light-shielding layers disposed higher than the pixel electrode layers, extending in the column direction, arranged side-by-side in the row direction, and overlapping the row-direction edge portions of the pixel electrode layers in plan view of the substrate; and a plurality of row light-shielding layers disposed higher than the pixel electrode layers, extending in the row direction, arranged side-by-side in the column direction, overlapping the column-direction edge portions of the pixel electrode layers and partially overlapping the contact regions in plan view of the substrate.

BRIEF DESCRIPTION OF THE DRAWINGS

These and other objects, advantages, and features of the technology pertaining to the present disclosure will become apparent from the following description thereof taken in conjunction with the accompanying drawings, which illustrate at least one specific embodiment of the technology pertaining to the present disclosure.

FIG. 7A, FIG. 7B, and FIG. 7C are schematic cross-sectional views illustrating states of processes in manufacturing the organic EL display panel 10.

DESCRIPTION OF EMBODIMENT

Summary of Embodiment

Figure 1:
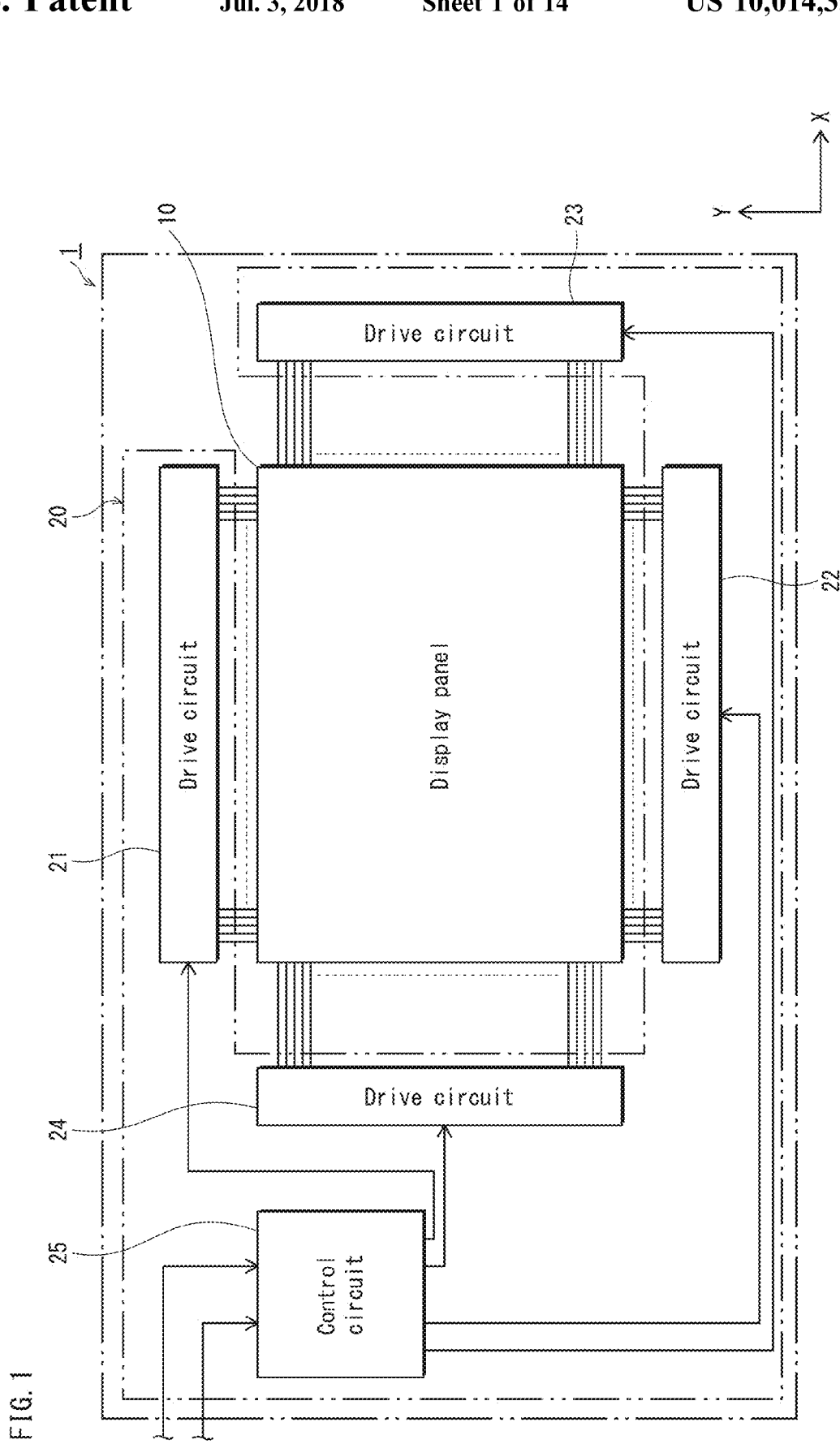
FIG. 1 is a schematic block diagram illustrating a configuration of a display device 1 pertaining to an embodiment.

An organic EL display panel pertaining to the present embodiment is an organic EL display panel in which a plurality of pixels are arranged in a row direction and a column direction in a matrix, the organic EL display panel including: a substrate; a plurality of pixel electrode layers arranged in the row direction and the column direction in a matrix on the substrate, the pixel electrode layers including a light-reflective material; a plurality of column banks disposed on the substrate and on the pixel electrode layers, covering row-direction edge portions of the pixel electrode layers, extending in the column direction, arranged side-by-side in the row direction, and defining row-direction edges of self-luminous regions of the pixels; a plurality of row banks disposed on the substrate and on the pixel electrode layers, covering column-direction edge portions of the pixel electrode layers and contact regions of the pixel electrode layers that are for electrically connecting the pixel electrode layers, extending in the row direction, arranged side-by-side in the column direction, and defining column-direction edges of the self-luminous regions; a plurality of light-emitting layers disposed above the pixel electrode layers in intervals between adjacent ones of the column banks; an opposing electrode layer disposed above the light-emitting layers, the opposing electrode layer including a light-transmissive material; a plurality of column light-shielding layers disposed higher than the pixel electrode layers, extending in the column direction, arranged side-by-side in the row direction, and overlapping the row-direction edge portions of the pixel electrode layers in plan view of the substrate; and a plurality of row light-shielding layers disposed higher than the pixel electrode layers, extending in the row direction, arranged side-by-side in the column direction, overlapping the column-direction edge portions of the pixel electrode layers and partially overlapping the contact regions in plan view of the substrate.

Further, according to an example of the embodiment, a plurality of thin-film transistors are arranged in the row direction and the column direction in a matrix in the substrate, in positions corresponding to the pixels, wherein sources or drains of the thin-film transistors are connected to the pixel electrode layers via connecting recesses in which portions of the pixel electrode layers in the contact regions are recessed in the direction of the substrate, and in plan view of the substrate, the row light-shielding layers do not overlap with the connecting recesses.

According to an example of the embodiment, the light-emitting layers extend continuously in the column direction above the row banks.

According to an example of the embodiment, the light-emitting layers are interrupted by the row banks.

According to an example of the embodiment, any two of the light-emitting layers disposed in the intervals between the column banks that are adjacent to each other in the row direction emit different colors of light from each other.

According to an example of the embodiment, any one of the light-emitting layers interrupted by the row banks in the column direction emits the same color of light along its length in the column direction.

According to an example of the embodiment, an upper substrate is disposed above the opposing electrode, the upper substrate including a light-transmissive material, wherein the row light-shielding layers and the column light-shielding layers are disposed in direct contact with the upper substrate.

According to an example of the embodiment, an upper substrate is disposed above the opposing electrode, the upper substrate including a light-transmissive material, wherein the row light-shielding layers, the column light-shielding layers, or both the row light-shielding layers and the column light-shielding layers are disposed in direct contact with the upper substrate.

According to an example of the embodiment, an upper substrate is disposed above the opposing electrode, the upper substrate including a light-transmissive material, wherein the row light-shielding layers and the column light-shielding layers are disposed in direct contact with the upper substrate.

According to an example of the embodiment, the column light-shielding layers are disposed on upper surfaces of the column banks.

According to an example of the embodiment, the row light-shielding layers are disposed on upper surfaces of the row banks.

An organic EL element pertaining to the present embodiment is an organic EL element including: a substrate; a pixel electrode layer disposed on the substrate, the pixel electrode layer including a light-reflective material; banks disposed on the substrate and on the pixel electrode layer, covering edge portions of the pixel electrode layer and a portion of a contact region of the pixel electrode layer, the contact region being for electrically connecting the pixel electrode layer; a light-emitting layer disposed above the pixel electrode layer; an opposing electrode layer disposed above the light-emitting layer, the opposing electrode layer including a light-transmissive material; and a light-shielding layer disposed higher than the pixel electrode layer, the light-shielding layer overlapping the edge portions of the pixel electrode layers and partially overlapping the contact region in plan view of the substrate.

A method of manufacturing an organic EL display panel pertaining to the present embodiment is a method including: preparing a substrate; disposing a plurality of pixel electrode layers in a row direction and a column direction in a matrix on the substrate, the pixel electrode layers including a light-reflective material; disposing a plurality of column banks on the substrate and on the pixel electrode layers, the column banks covering row-direction edge portions of the pixel electrode layers, extending in the column direction, and arranged side-by-side in the row direction; disposing a plurality of row banks on the substrate and on the pixel electrode layers, the row banks covering column-direction edge portions of the pixel electrode layers, extending in the row direction, and arranged side-by-side in the column direction; disposing a plurality of light-emitting layers above the pixel electrode layers in intervals between adjacent ones of the column banks; disposing an opposing electrode layer above the light-emitting layers, the opposing electrode layer including a light-transmissive material; disposing, higher than the pixel electrode layers, a plurality of row light-shielding layers extending in the row direction, arranged side-by-side in the column direction, and overlapping the column-direction edge portions of the pixel electrode layers in plan view of the substrate; and disposing, higher than the pixel electrode layers, a plurality of column light-shielding layers extending in the column direction, arranged side-by-side in the row direction, overlapping the row-direction edge portions of the pixel electrode layers and partially overlapping the contact regions in plan view of the substrate.

Embodiment

1. Overall Configuration of Display Device 1

The following describes an overall configuration of the display device 1 pertaining to the embodiment, with reference to FIG. 1.

As illustrated in FIG. 1, the display device 1 pertaining to the present embodiment includes an organic EL display panel 10 (hereinafter referred to as "display panel 10") and a drive control circuit 20 connected thereto.

The display panel 10 is an organic electroluminescence (EL) panel that uses electroluminescence of organic material, in which a plurality of organic EL elements are, for example, arrayed in a matrix. The drive control circuit 20 comprises four drive circuits 21, 22, 23, 24 and a control circuit 25.

The arrangement of circuits of the drive control circuit 20 with respect to the display panel 10 in the display device 1 is not limited to the configuration illustrated in FIG. 1.

2. Circuit Configuration in Display Panel 10

Figure 2:
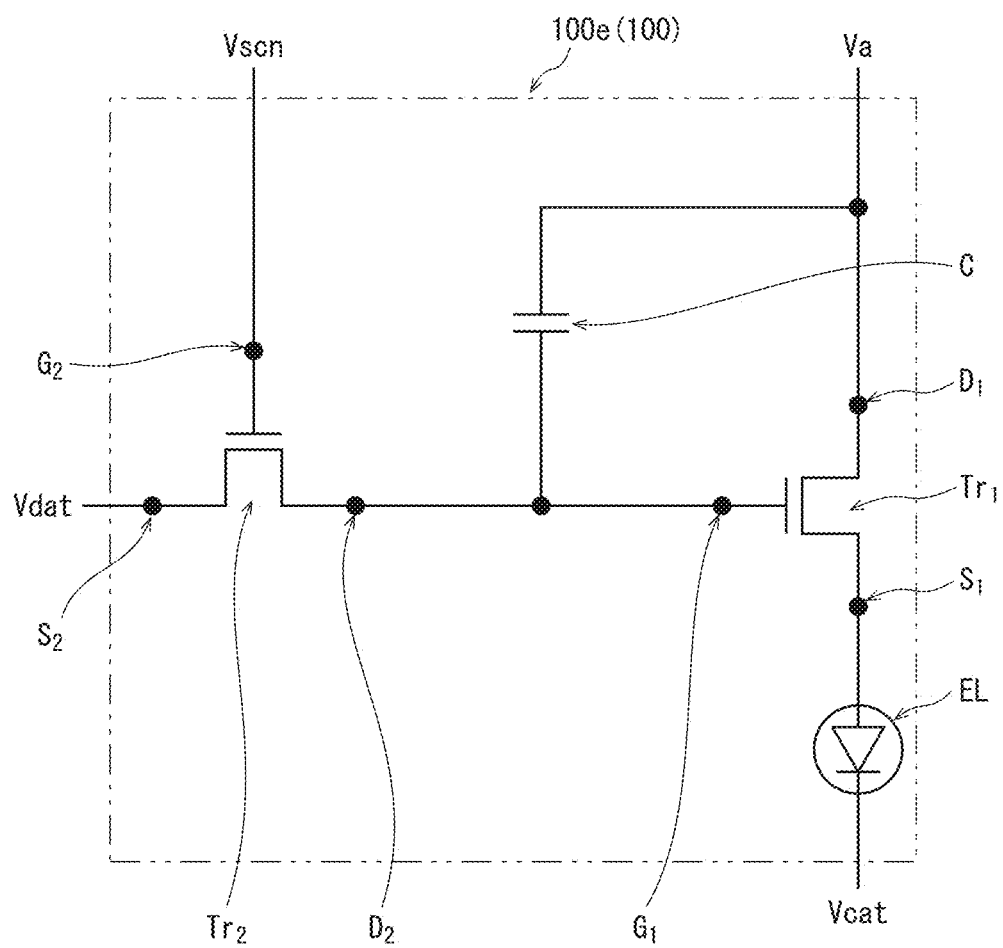
FIG. 2 is a schematic circuit diagram showing a circuit configuration of a pixel 100e of an organic EL display panel 10 used in the display device 1.

The following describes circuit configuration of organic EL elements 100 included in pixels in the display panel 10, with reference to FIG. 2. FIG. 2 is a schematic circuit diagram showing a circuit configuration in each of the organic EL elements 100, which correspond to pixels 100e of the organic EL display panel 10 used in the display device 1. As shown in FIG. 2, in the display panel 10 pertaining to the present embodiment, each of the organic EL elements 100 in the pixels 100e includes two transistors Tr1, Tr2, a capacitor C, and an EL element portion EL as a light-emitter. Of the two transistors Tr1, Tr2, the transistor Tr1 is a drive transistor and the transistor Tr2 is a switching transistor.

A gate G2 of the switching transistor Tr2 is connected to a scan line Vscn and a source S2 is connected to a data line Vdat. A drain D2 of the switching transistor Tr2 is connected to a gate G1 of the drive transistor Tr1.

A drain D1 of the drive transistor Tr1 is connected to a power supply line Va, and a source S1 is connected to a pixel electrode layer (anode) of the EL element portion EL. An opposing electrode layer (cathode) of the EL element portion EL is connected to a ground line Vcat.

The capacitor C connects the drain D2 of the switching transistor Tr2, the gate G1 of the drive transistor Tr1, and the power supply line Va.

In the display panel 10, the organic EL elements 100 in the pixels 100e that each have the circuit configuration shown in FIG. 2 are disposed in a matrix to form a display region.

3. Overall Configuration of Organic EL Display Panel 10

The following describes the display device 10 pertaining to the embodiment, with reference to the drawings. The drawings are schematic diagrams, and scale may be different from an actual implementation.

Figure 3:
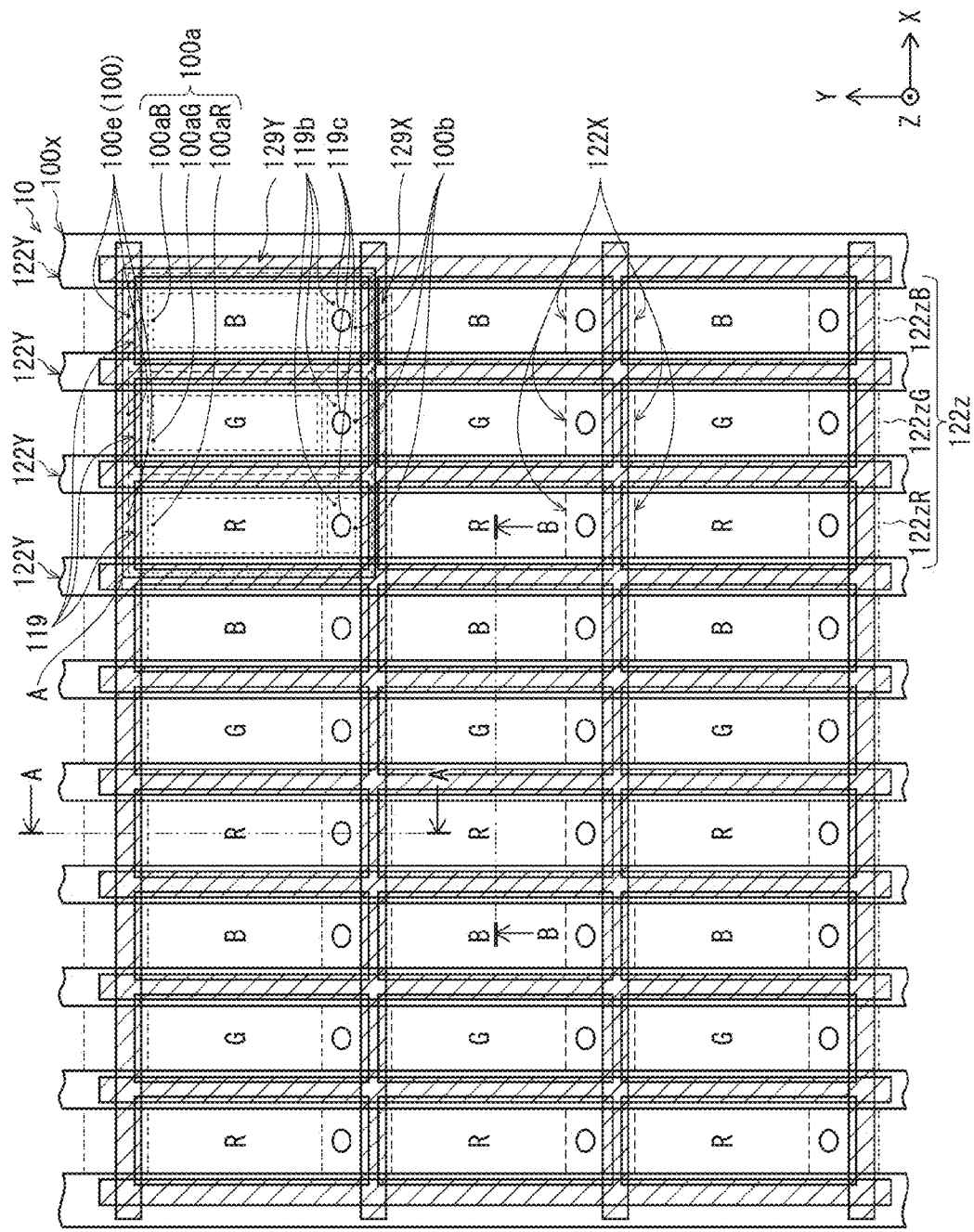
FIG. 3 is a schematic plan view illustrating a portion of the organic EL display panel 10.

FIG. 3 is a schematic plan view illustrating a portion of a display panel pertaining to the embodiment. The display panel 10 is an organic EL display panel that uses electroluminescence of an organic compound, and has a top-emission configuration emitting light from an upper surface thereof, in which a plurality of the organic EL elements 100 are arranged in a matrix on a substrate 100x (TFT substrate) on which thin film transistors (TFT) are disposed. As shown in FIG. 3, in the display panel 10, the organic EL elements 100 that make up pixels are disposed in a matrix.

In the display panel 10, in the pixels 100e, self-luminous regions 100a are formed, which are regions that emit light by using an organic compound. The self-luminous regions 100a are in three varieties, a region that emits red light 100aR, a region that emits green light 100aG, and a region that emits blue light 100aB (hereinafter, when 100aR, 100aG, 100aB are not distinguished they are referred to by "100a"). Three self-luminous regions 100aR, 100aG, 100aB lined up in a row direction are a set that make up one pixel in a color display.

As shown in FIG. 3, in the display panel 10, a plurality of pixel electrode layers 119 are arranged in a matrix on the substrate 100x. The pixel electrode layers 119 each have a rectangular shape in plan view and include a light-reflective material.

In the display panel 10, elongated banks are used, each bank of column banks 122Y extending in a column direction (direction 3Y in the drawings) and the column banks 122Y being arranged side-by-side in a row direction. Each of the column banks 122Y is disposed above row-direction edge portions of two of the pixel electrode layers 119 that are adjacent in the row direction.

When gaps between adjacent ones of the column banks 122Y are defined as intervals 122z, the display panel 10 has a configuration in which the column banks 122Y and the intervals 122z alternate in the row direction. The intervals are sub-divided into red intervals 122zR that correspond to the self-luminous regions 100aR, green intervals 122zG that correspond to the self-luminous regions 100aG, and blue intervals 122zB that correspond to the self-luminous regions 100aB (hereinafter, when the red intervals 122zR, the green intervals 122zG, and the blue intervals 122vB are not distinguished they are collectively referred to as the intervals 122z). Row-direction edges of the self-luminous regions 100a are defined by row-direction edges of the column banks 122Y.

In the intervals 122z, each bank of row banks 122X extends in a row direction (direction X in FIG. 3) and the row banks 122X are arranged side-by-side in a column direction. Each of the row banks 122X is disposed above column-direction edges of two adjacent ones of the pixel electrode layers 119 that are adjacent in the column direction. In the intervals 122z, regions in which the row banks 122X are disposed become not-self-luminous regions 100b. Thus, edges of the self-luminous regions 100a in the column direction are defined by column-direction edges of the row banks 122X. In the intervals 122z, the self-luminous regions 100a and the not-self-luminous regions 100b alternate in the column direction. In the not-self-luminous regions 100b are disposed connection recesses 119c that connect the pixel electrode layers 119 to the sources S1 of the TFTs via connecting electrode layers 117, and contact regions 119b (contact windows) on the pixel electrode layers 119 for electrically connecting the pixel electrode layers 119.

The column banks 122Y and the row banks 122X are orthogonal to each other, and the row banks 122X overlap with the self-luminous regions 100a in the column direction (hereinafter, when the row banks 122X and the column banks 122Y are not distinguished, they are referred to as the banks 122). Further, above the pixel electrode layers 119, column light-shielding layers 129Y are disposed that overlap with row-direction edge portions of the pixel electrode layers 119, and row light-shielding layers 129X are disposed that overlap with column-direction edge portions of the pixel electrode layers 119 and do not overlap with portions of the contact regions 119b.

4. Elements of Display Panel 10

Figure 4:
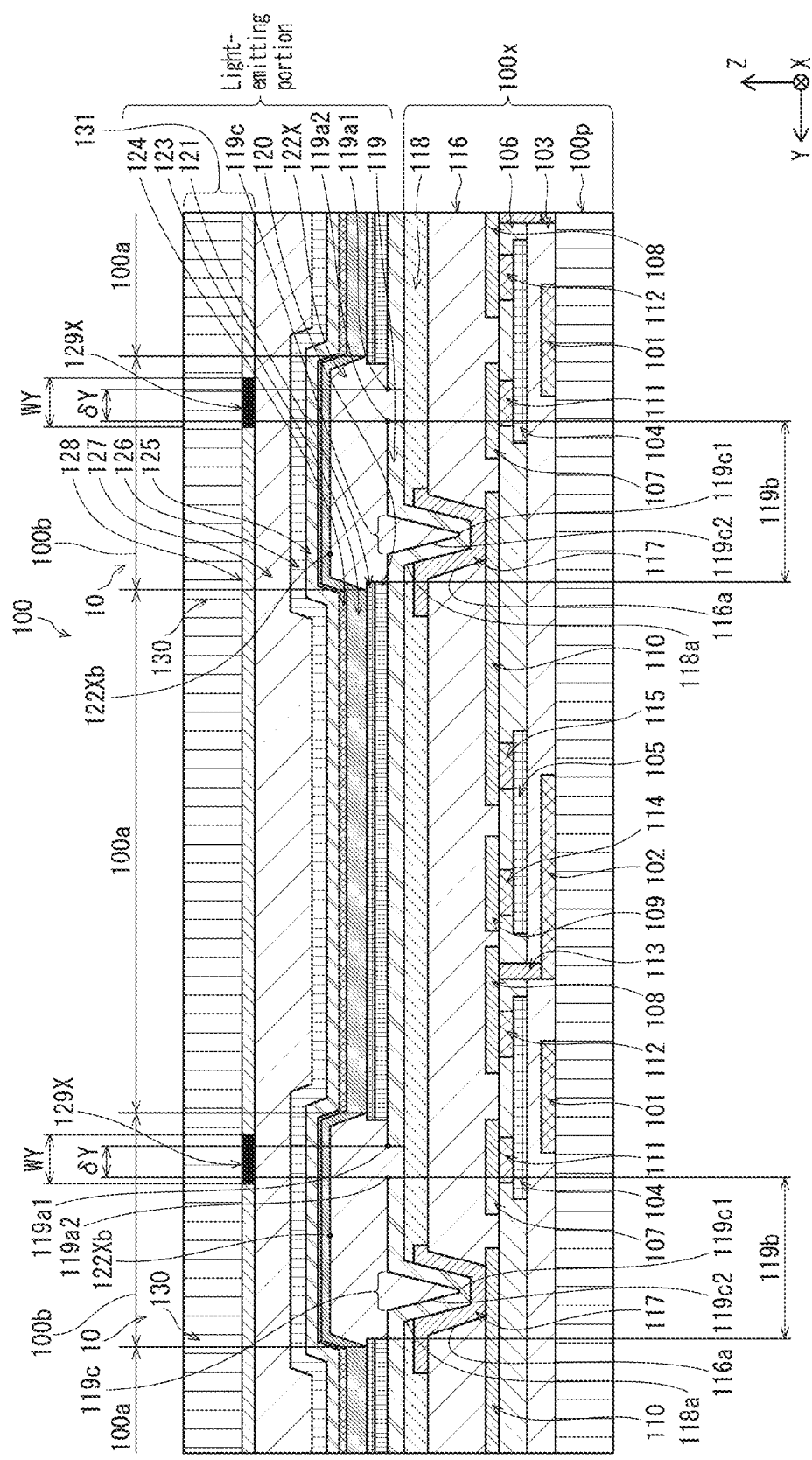
FIG. 4 is a schematic cross-sectional view of A-A in FIG. 3.
Figure 5:
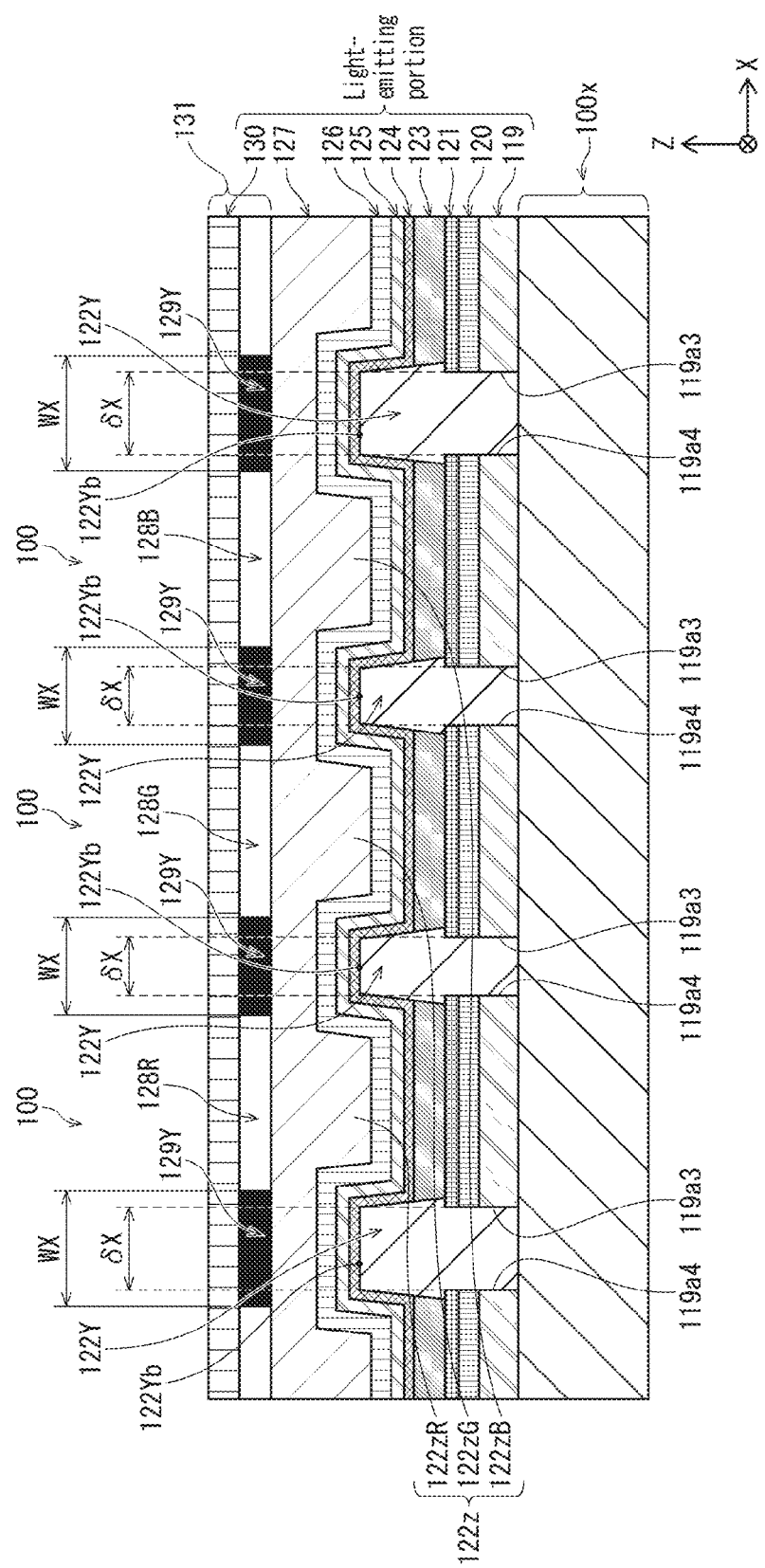
FIG. 5 is a schematic cross-sectional view of B-B in FIG. 3.

The following describes configuration of the organic EL elements 100 in the display panel 10 with reference to the schematic cross-sectional views of FIG. 4 and FIG. 5. FIG. 4 is a schematic cross-sectional view of A-A in FIG. 3. FIG. 5 is a schematic cross-sectional view of B-B in FIG. 3.

The display panel 10 pertaining to the present embodiment is a top-emission type of organic EL display panel. In a Z axis direction at a lower end thereof is the substrate 100x (TFT substrate) including thin film transistors. On the substrate 100x is disposed an organic EL element portion.

4.1 Substrate 100x (TFT Substrate)

As illustrated in FIG. 4, gate electrodes 101, 102 are disposed on a lower substrate 100p, and a gate insulating layer 103 is disposed covering the gate electrodes 101, 102 and a surface of the substrate 100x. Channel layers 104, 105 corresponding to the gate electrodes 101, 102 are disposed on the gate insulating layer 103. A channel protection layer 106 is disposed covering the channel layers 104, 105 and a surface of the gate insulating layer 103.

On the channel protection layer 106, source electrodes 107 and drain electrodes 108 are disposed with intervals therebetween, corresponding to the gate electrodes 101 and the channel layers 104. Similarly, source electrodes 110 and drain electrodes 109 are disposed with intervals therebetween, corresponding to the gate electrodes 102 and the channel layers 105.

Under the source electrodes 107, 110 and the drain electrodes 108, 109 are disposed source lower electrodes 111, 115 and drain lower electrodes 112, 114, penetrating the channel protection layer 106. At Z axis direction lower portions thereof, the source lower electrodes 111 and the drain lower electrodes 112 are in contact with the channel layers 104. At Z axis direction lower portions thereof, the drain lower electrodes 114 and the source lower electrodes are in contact with the channel layers 105.

Further, the drain electrodes 108 and the gate electrodes 102 are connected to each other by connector plugs 113, which penetrate the gate insulating layer 103 and the channel protection layer 106.

The gate electrodes 101 correspond to the gate G2 in FIG. 2, the source electrodes 107 correspond to the source S2 in FIG. 2, and the drain electrodes 108 correspond to the drain D2 in FIG. 2. Similarly, the gate electrodes 102 correspond to the gate G1 in FIG. 1, the source electrodes 110 correspond to the source S1 in FIG. 1, and the drain electrodes 109 correspond to the drain D1 in FIG. 1. Accordingly, the switching transistor Tr2 is formed at a Y axis direction left-hand side of FIG. 4, and the drive transistor Tr1 is formed further right in the Y axis direction of FIG. 4.

However, the configuration described above is merely an example, and the transistors Tr1, Tr2 may be configured as top-gate type, bottom-gate type, channel etch type, etch stop type, etc., transistors, and are not limited to the configuration illustrated in FIG. 4.

A passivation layer 116 is disposed covering the source electrodes 107, 110, the drain electrodes 108, 109, and the channel protection layer 106. Contact holes 116a are formed in the passivation layer 116 above portions of the source electrodes 110, and connecting electrode layers 117 are layered to follow the contours of the contact holes 116a.

In the Z axis direction, lower portions of the connecting electrode layers 117 are connected to the source electrodes 110 and parts of upper portions of the connecting electrode layers 117 are on the passivation layer 116. An interlayer insulating layer 118 is disposed on and covering the connecting electrode layers 117 and the passivation layer 116.

4.2 Organic EL Element Portion (1) Pixel Electrode Layers 119

For each pixel, one of the pixel electrode layers 119 is disposed on the interlayer insulating layer 118. The pixel electrode layers 119 supply carriers to the light-emitting layers 123; for example, when functioning as anodes they supply holes to the light-emitting layers 123. Further, the panel 10 is a top emission type, and therefore the pixel electrode layers 119 are light-reflective. Each of the pixel electrode layers 119 has a flat rectangular shape. The pixel electrode layers 119 are disposed on the substrate 100x with intervals δX therebetween in the row direction and intervals δY therebetween in the column direction in the intervals 122z. Further, the connecting recesses 119c of the pixel electrode layers 119 are connected to the connecting electrode layers 117 via contact holes 118a formed in the connecting electrode layers 117 and the interlayer insulating layer 118. Thus, via the connecting electrode layers 117, the pixel electrode layers 119 and the source S1 of the TFT are connected.

The connecting recesses 119c are concavities in portions of the pixel electrode layers 119, recessed towards the substrate 100x, composed of bottom portions 119c1 and inner peripheral surface portions 119c2. Surfaces of the inner peripheral surface portions 119c2 are preferably conical (tapered) inclined slopes. This is in order that a portion of light that leaks in the column direction from the light-emitting layers 123 can be reflected upwards.

(2) Hole Injection Layers 120, Hole Transport Layers 121

Hole injection layers 120 and hole transport layers 121 are disposed in this order on the pixel electrode layers 119, the hole transport layers 121 being in contact with the hole injection layers 120. The hole injection layers 120 and hole transport layers 121 have the function of transporting holes injected from the pixel electrode layers 119 to the light-emitting layers 123.

(3) Banks 122

The banks 122 are disposed covering edges of the pixel electrode layers 119, the hole injection layers 120, and the hole transport layers 121. The banks 122 include an insulative material. The banks 122 include column banks 122Y that extend in the column direction and are lined up in the row direction, and row banks 122X that extend in the row direction and are lined up in the column direction. The column banks 122Y and the row banks 122X form a lattice shape.

The column banks 122Y prevent flow in the row direction of ink containing an organic compound that is a material of the light-emitting layers 123, and define row-direction edges of the light-emitting layers 123. The column banks 122Y are disposed above edge portions 119$a$3, 119$a$4 in the row direction of the pixel electrode layers 119, covering portions of the pixel electrode layers 119.

The row banks 122X are for suppressing flow in the column direction of ink containing the organic compound that is a material of the light-emitting layers 123. The row banks 122X are disposed above edge portions 119$a$1, 119$a$2 in the column direction of the pixel electrode layers 119, covering portions of the pixel electrode layers 119. Thus, the row banks 122X define edges of self-luminous regions of pixels in the column direction, as described above. The row banks 122X linearly extend in the row direction and a cross-section taken parallel to the column direction shows a trapezoidal shape that tapers upwards. The row banks 122X pass through the column banks 122Y, following the row direction that is perpendicular to the column direction. The row banks 122X have upper surfaces that are lower than upper surfaces of the column banks 122Y. Thus, openings corresponding to the self-luminous regions 100$a$ are formed by the rows banks 122X and the column banks 122Y.

(4) Light-Emitting Layers 123

The display panel 10 has a configuration in which the column banks 122Y and the intervals 122$z$ alternate in the row direction. The light-emitting layers 123 are formed in the intervals 122$z$, which are defined by the column banks 122Y, and extend in the column direction. The light-emitting layers 123 that emit light of the following colors are disposed in the red intervals 122$z$R that correspond to the self-luminous regions 100$a$R, the green intervals 122$z$G that correspond to the self-luminous regions 100$a$G, and the blue intervals 122$z$B that correspond to the self-luminous regions 100$a$B.

The light-emitting layers 123 are layers including organic compounds and have a function of emitting light due to recombination of holes and electrons therein. In the intervals 122$z$, the light-emitting layers 123 extend linearly in the column direction.

The light-emitting layers 123 emit light only from portions thereof that are supplied with carriers from the pixel electrode layers 119, and therefore electroluminescence of organic compounds does not occur in areas in which the row banks 122X are present, the row banks 122X being interlayer insulators. Thus, the light-emitting layers 123 emit light only from portions where the row banks 122X are not present, these portions are the self-luminous regions 100$a$, and edges of the self-luminous regions 100$a$ in the column direction are defined by edges of the row banks 122X in the column direction.

Portions of the light-emitting layers 123 above the row banks 122X do not emit light and these portions are the not-self-luminous regions 100$b$. In other words, the not-self-luminous regions 100$b$ are regions obtained by projecting the row banks 122X in a plan view direction. The light-emitting layers 123 are disposed on upper surfaces of the hole transport layers 121 in the self-luminous regions 100$a$ and on upper and side surfaces of the row banks 122X in the not-self-luminous regions 100$b$.

As illustrated in FIG. 4, the light-emitting layers 123 extend into the not-self-luminous regions 100$b$ that are contiguous, and not only the self-luminous regions 100$a$. Thus, when forming the light-emitting layers 123, ink applied to the self-luminous regions 100$a$ can flow in the column direction via ink applied to the not-self-luminous regions 100$b$, and film thickness thereof can be planarized between pixels in the column direction. However, in the not-self-luminous regions 100$b$, flow of ink is appropriately suppressed by the row banks 122X. Accordingly, large irregularities in film thickness in the column direction are unlikely to occur, and irregularity in luminance of each pixel is improved.

(5) Electron Transport Layer 124

The electron transport layer 124 is disposed on the banks 122 and on the light-emitting layers 123 in the openings defined by the banks 122. Further, in the present example, the electron transport layer 124 is also disposed on the column banks 122Y that are exposed above the light-emitting layers 123. The electron transport layer 124 has the function of transporting electrons injected from the opposing electrode layer 125 to the light-emitting layers 123.

(6) Opposing Electrode Layer 125

The opposing electrode layer 125 is disposed on the electron transport layer 124, covering the electron transport layer 124. The opposing electrode layer 125 is disposed continuously across an entire surface of the display panel 10 and may be connected to bus bar wiring per pixel, or per plurality of pixels (not illustrated). The opposing electrode layer 125 creates electrical paths by opposing the pixel electrode layers 119, sandwiching the light-emitting layers 123, and supplies carriers to the light-emitting layers 123. For example, when the opposing electrode layer 125 functions as a cathode, it supplies electrons to the light-emitting layers 123. The opposing electrode 125 conforms to the surface of the electron transport layer 124 and is a common electrode across the light-emitting layers 123.

The opposing electrode 125 uses a light-transmissive electrically conductive material, because the display panel 10 is a top-emission type. For example, indium tin oxide (ITO) or indium zinc oxide (IZO) may be used. Further, silver (Ag) or aluminium (Al) may be used as a thin film electrode.

(7) Sealing Layer 126

The sealing layer 126 is disposed on the opposing electrode layer 125, covering the opposing electrode layer 125. The sealing layer 126 is for suppressing degradation of the light-emitting layer 123 due to contact with moisture, air, etc. The sealing layer 126 is disposed across an entire surface of the display panel 10, covering an upper surface of the opposing electrode layer 125. As a material of the sealing layer 126, a light-transmissive material is used such as silicon nitride or silicon oxynitride, because the display panel 10 is a top-emission type.

(8) Joining Layer 127

Above the sealing layer 126 in the Z axis direction is disposed a CF substrate 131, joined to the sealing layer 126 by the joining layer 127. The CF substrate includes the upper substrate 130 and color filter layers 128 and the light-shielding layers 129 below the upper substrate in the Z axis direction. The joining layer 127 has a function of joining a back panel, in other words each layer from the substrate 100x to the sealing layer 126, to the CF substrate 131, and a function of preventing each layer from being exposed to moisture or air.

(9) Upper Substrate 130

The CF substrate 131 is disposed on and joined to the joining layer 127. The CF substrate 131 includes the upper substrate 130, the color filter layers 128, and the shielding layers 129. For the upper substrate 130, a light-transmissive material is used such as cover glass or light-transmissive resin film, because the display panel 10 is a top-emission type. Further, the upper substrate 130 can improve stiffness of the display panel 10 and prevent penetration of the display panel 10 by moisture or air.

(10) Color Filter Layers 128

Color filter layers 128 are disposed under the upper substrate 130 at locations corresponding to the self-luminous regions 100a of each color of pixel. The color filter layers 128 are light-transmissive layers for transmitting visible light of wavelengths corresponding to red, green, and blue, and have a function of transmitting light emitted from each color of pixel and correcting the chromaticity thereof. In the present example, above the self-luminous regions 100aR in the red intervals 122zR, the self-luminous regions 100aG in the green intervals 122zG, and the self-luminous regions 100aB in the blue intervals, are disposed red color filter layers 128R, green color filter layers 128G, and blue color filter layers 128B, respectively. The color filter layers 128 are formed, for example, by a process of applying ink containing a color filter material and a solvent to the upper substrate 130, the upper substrate 130 being made from cover glass that has openings corresponding to pixels in a matrix for forming color filters.

(11) Light-Shielding Layer 129

The light-shielding layer 129 is disposed under the upper substrate 130 in locations corresponding to boundaries between the self-luminous regions 100a of pixels.

The light-shielding layer 129 is a black resin layer for preventing transmission of visible light in wavelengths corresponding to red, green, and blue. For example, the light-shielding layer 129 is composed of a resin material that includes black pigment that has excellent light-absorbing and light-shielding properties. The light-shielding layer 129 is intended to prevent entry of external light into the display panel 10, prevent visibility of internal parts through the upper substrate 130, and improve contrast of the display panel 10 to suppress glare from external light. Glare from external light is a phenomenon caused by external light entering the display panel 10 from above the upper substrate 130, being reflected at the pixel electrode layers 119, and being emitted from the upper substrate 130.

Further, the light-shielding layer 129 has a function of preventing, by blocking a portion of light emitted from a pixel that leaks to adjacent pixels, boundaries between pixels becoming unclear, and has a function of increasing color purity of light emitted from pixels.

The light-shielding layer 129 includes column light-shielding layers 129Y that extend in the column direction and are lined up in the row direction, and row light-shielding layers 129X that extend in the row direction are lined up in the column direction, the column light-shielding layers 129Y and the row light-shielding layers 129X forming a matrix.

In the organic EL elements 100, the column light-shielding layers 129Y are disposed in positions overlapping row-direction edge portions 119a3, 119a4 of the pixel electrode layers 119 (hereinafter, when 119a3 and 119a4 are not distinguished, they are referred to as "edge portions 119a"), as illustrated in FIG. 5, and the row light-shielding layers 129X are disposed in positions overlapping column-direction edge portions 119a1, 119a2 of the pixel electrode layers 119 (hereinafter, when 119a1 and 119a2 are not distinguished, they are referred to as "edge portions 119a"), as illustrated in FIG. 4. Thus, a width WX in the row direction of the column light-shielding layers 129Y is greater than a distance δX in the row direction between adjacent ones of the pixel electrode layers 119, and a width WY in the column direction of the row light-shielding layers 129X is greater than a distance δY in the column direction between adjacent ones of the pixel electrode layers 119. Thus, external light reflection in the display panel 10 can be effectively suppressed by arrangement of the light-shielding layer 129 above edge portions of the pixel electrode layers 119.

In the organic EL elements 100, as described above, the self-luminous regions 100a and the not-self-luminous regions 100b are arranged alternating with each other in the column direction. When regions where row banks 122X overlap with portions of the pixel electrode layers 119 nearest the edge portions 119a2 of the pixel electrode layers 119 on the side of the connecting recesses 119c are defined as contact regions 119b of the pixel electrode layers 119 for electrically connecting the pixel electrode layers 119, the row light-shielding layers 129X are disposed in positions that do not overlap with portions of the contact regions 119b of the pixel electrode layers 119, as illustrated in FIG. 4. According to this configuration, light emission efficiency of the organic EL elements 100 is improved. The improvement in light emission efficiency is described later.

4.3 Materials

The following illustrates one example of materials of elements shown in FIG. 4 and FIG. 5.

(1) Substrate 100x (TFT Substrate)

As the lower substrate 100p, for example, a glass substrate, a silica glass substrate, a metal substrate such as molybdenum sulfide, copper, zinc, aluminium, stainless steel, magnesium, iron, nickel, gold, or silver, a semiconductor substrate based on gallium arsenide, or a plastic substrate can be used.

As a plastic material, any thermoplastic or thermosetting resin may be used. For example, polyolefin such as polyethylene, polypropylene, ethylene-propylene copolymer, ethylene-vinyl acetate copolymer (EVA), cyclic polyolefin, modified polyolefin, polyvinyl chloride, polyvinylidene chloride, polystyrene, polyamide, polyimide (PI), polyamide-imide, polycarbonate, poly-(4-methyl-1-pentene), ionomer, acrylic resin, polymethyl methacrylate, styrene acrylonitrile copolymer (SAN), butadiene styrene copolymer, ethylene vinyl alcohol (EVOH), polyethylene terephthalate (PET), polybutylene terephthalate, polyethylene naphthalate (PEN), polyester such as polycyclohexylenedimethylene terephthalate (PCT), polyether, polyether ketone, polyether sulfone (PES), polyetherimide, polyacetal, polyphenylene oxide, modified polyphenylene oxide, polyarylate, aromatic polyester (liquid crystal polymer), polytetrafluoroethylene, polyvinylidene fluoride, other fluorine-based resins, various thermoplastic elastomers such as styrene-, polyolefin-, polyvinylidene chloride-, polyurethane-, fluorine rubber-, or chlorinated polyethylene-based thermoplastic elastomers, epoxy resin, phenol resin, urea resin, melamine resin, unsaturated polyester, silicone resin, polyurethane, or a copolymer, blend, polymer alloy, etc., primarily consisting of one of the above, or a layered body including layers of one or more of the above can be used.

As the gate electrodes 101, 102, a layered body of copper (Cu) and molybdenum (Mo) can be used, for example. The material of the gate electrodes 101, 102 is not limited to this example, and other metal material may be used.

As a material of the gate electrode layer 103, as long as the material is electrically insulating a known organic material or inorganic material can be used, such as silicon oxide (SiO$_2$) or silicon nitride (SiNx), for example.

As the channel layers 104, 105, an oxide semiconductor including at least one material selected from indium (In), gallium (Ga), and zinc (Zn) can be used.

As a material of the channel protection layer 106, silicon oxynitride (SiON), silicon nitride (SiN), or aluminium oxide (AlOx) can be used, for example.

As the source electrodes 107, 110, and the drain electrodes 108, 109, layered bodies of copper-manganese (CuMn), copper (Cu), and molybdenum (Mo) can be used, for example.

Further, the source lower electrodes 111, 115 and the drain lower electrodes 112, 114 can be configured using the same materials as the source electrodes 107, 110 and the drain electrodes 108, 109.

The passivation layer 116 may use silicon oxide (SiO2), silicon nitride (SiN), or silicon oxynitride (SiON).

As the connecting electrode layers 117, layered bodies of molybdenum (Mo), copper (Cu), and copper-manganese (CuMn) may be used (Mo approx. 20 nm, Cu approx. 375 nm, and CuMn approx. 65 nm). However, thickness of each layer is not limited to this example, and thickness of a molybdenum (Mo) layer may be in a range from 5 nm to 200 nm, thickness of a copper (Cu) layer may be in a range from 50 nm to 800 nm, and thickness of a copper-manganese (CuMn) layer may be in a range from 5 nm to 200 nm. Material used in the connecting electrode layers 117 is not limited to this example, and may be selected from appropriate electrically conductive materials.

The interlayer insulating layer is formed from an organic compound such as polyimide, polyamide, or an acrylic-based resin, and has a thickness of approx. 4000 nm. However, thickness is not limited to this example, and may be in a range from 2000 nm to 8000 nm, for example.

(2) Pixel Electrode Layers 119

The pixel electrode layers 119 are made from metal material. In the case of the display panel 10 pertaining to the present embodiment, surfaces of the pixel electrode layers 119 are preferably highly reflective. In the display panel 10 pertaining to the present embodiment, the pixel electrode layers 119 may each be a structure in which a plurality of layers are selected from metal layers, alloy layers, and light-transmissive electrically-conductive layers. As a metal layer, a metal material including silver (Ag) or aluminium (Al) may be used, for example. As an alloy layer, silver palladium copper alloy (APC), silver palladium gold alloy (ARA), molybdenum chromium alloy (MoCr), or nickel chromium alloy (NiCr) may be used, for example. As a light-transmissive electrically-conductive material, indium tin oxide (ITO) or indium zinc oxide (IZO) may be used, for example.

(3) Hole Injection Layers 120

The hole injection layers 120 are layers made from an oxide of silver (Ag), molybdenum (Mo), chromium (Cr), vanadium (V), tungsten (W), nickel (Ni), or iridium (Ir), or an electrically conductive polymer such as poly(3,4-ethylenedioxythiophene) polystyrene sulfonate (PEDOT:PSS).

In a case of the hole injection layers 120 being configured from a transition metal oxide, a plurality of energy levels can be obtained from a plurality of valences, and as a result hole injection becomes easier and drive voltage can be decreased.

(4) Hole Transport Layers 121

For the hole transport layers 121, a high molecular compound such as polyfluorene, a derivative thereof, poly arylamine, or a derivative thereof may be used, for example.

(5) Banks 122

The banks 122 are formed from an organic material such as a resin and have insulating properties. As examples of organic materials that may be used in forming the banks 122, acrylic-based resin, polyimide-based resin, or novalac-type phenolic resin may be used. The banks 122 preferably have organic solvent resistance. Further, during the production process, the banks 122 are subjected to an etching process, a baking process, etc., and therefore the banks 122 are preferably formed from a material having a high resistance to deformation, deterioration, etc., during such processes. Further, in order to impart water repellency to surfaces of the banks 122, the surfaces may be fluorine-treated. Further, the banks 122 may be formed by using material that contains fluorine.

Further, structure of the banks 122 is not limited to the single-layer structure illustrated in FIG. 4, and may be a multi-layered structure having two or more layers. In such a case, each layer may be a combination of the materials above, or each layer may be an inorganic material and an organic material.

(6) Light-Emitting Layers 123

The light-emitting layers 123, as stated above, have a function of emitting light generated by an excited state due to recombination of holes and electrons injected thereto. As a material used in forming the light-emitting layers 123 it is necessary to use a light emitting organic material that can form a thin film by using a wet printing method.

For example, as disclosed in JP H5-163488, a phosphorescent material is preferably used, such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group III metal, metal complex of oxine, rare earth complex, or similar.

(7) Electron Transport Layer 124

The electron transport layer 124 may be formed using an oxadiazole derivative (OXD), a triazole derivative (TAZ), or a phenanthroline derivative (BCP, Bphen), for example.

(8) Opposing Electrode Layer 125

The opposing electrode layer 125 may be formed from indium tin oxide (ITO) or indium zinc oxide (IZO), for example. Further, silver (Ag) or aluminium (Al) may be used as a thin film electrode.

(9) Sealing Layer 126

The sealing layer 126 has a function of suppressing exposure of organic layers such as the light-emitting layers 123 to moisture and air, and may be formed from a light-transmissive material such as silicon nitride (SiN) or silicon oxynitride (SiON). Further, on a layer formed from a material such as silicon nitride (SiN) or silicon oxynitride (SiON), a sealing resin layer composed of resin material such as acrylic resin or silicone resin may be provided.

The sealing layer 126, in the case of the display panel 10 pertaining to present embodiment, which is a top-emission type, is necessarily formed from a light-transmissive material.

(10) Joining Layer 127

The joining layer 127 may be made from a resin adhesive, for example. The joining layer 127 may be made from a light-transmissive resin material such as acrylic resin, silicone resin, or epoxy resin.

(11) Upper Substrate 130

As a material of the upper substrate 130, a light-transmissive material may be used such as a glass substrate, silica glass substrate, or plastic substrate, for example.

(12) Color Filter Layers 128

As a material of the color filter layers 128, a known resin material may be used (examples of commercial products are color resists manufactured by JSR Co., Ltd).

(13) Light-Shielding Layer 129

As a material of the light-shielding layer 129, a resin material including an ultraviolet light curable resin (for example, an ultraviolet light curable acrylic resin) material as a main component and a black pigment as an additional component may be used. As the black pigment, a light-shielding material such as a carbon black pigment, titanium black pigment, metal oxide pigment, or organic pigment may be used.

5. Display Panel 10 Manufacturing Method

The following describes a method of manufacturing the display device 10, with reference to drawings from FIG. 6A to FIG. 9B.

(1) Forming Substrate 100x (TFT Substrate)

Figure 6A:
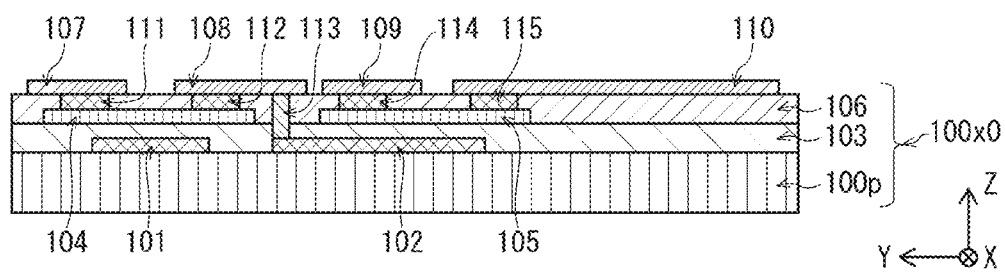
FIG. 6A, FIG. 6B, FIG. 6C, FIG. 6D, and FIG. 6E are schematic cross-sectional views illustrating states of processes in manufacturing the organic EL display panel 10.

First, as illustrated in FIG. 6A, a substrate 100x0 is prepared on which the source electrodes 107, 110 and the drain electrodes 108, 109 are formed. The substrate 100x0 can be manufactured by using a known TFT manufacturing method.

Figure 6B:
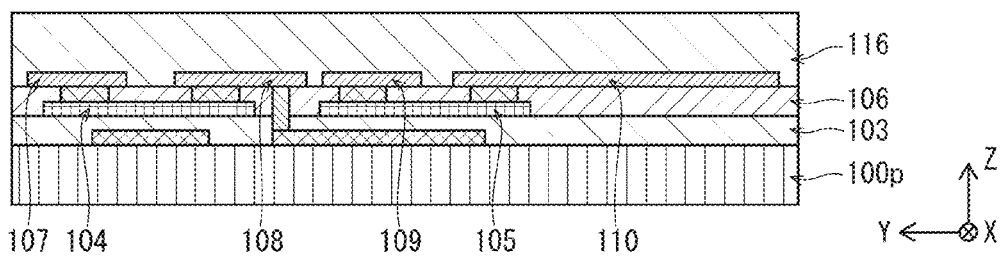

Subsequently, as illustrated in FIG. 6B, the passivation layer 116 is layered on the source electrodes 107, 110, the drain electrodes 108, 109, and the channel protection layer 106, by using a plasma CVD method or sputtering, for example.

Figure 6C:
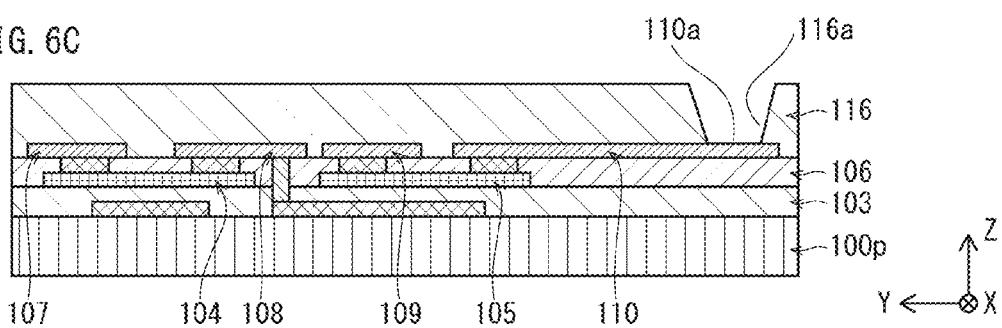

Subsequently, as illustrated in FIG. 6C, the contact holes 116a are opened in the passivation layer 116 at locations above the source electrodes 110, by using a dry etching method. Bottoms of the contact holes 116a are formed to expose surfaces 110a of the source electrodes 110.

Figure 6D:
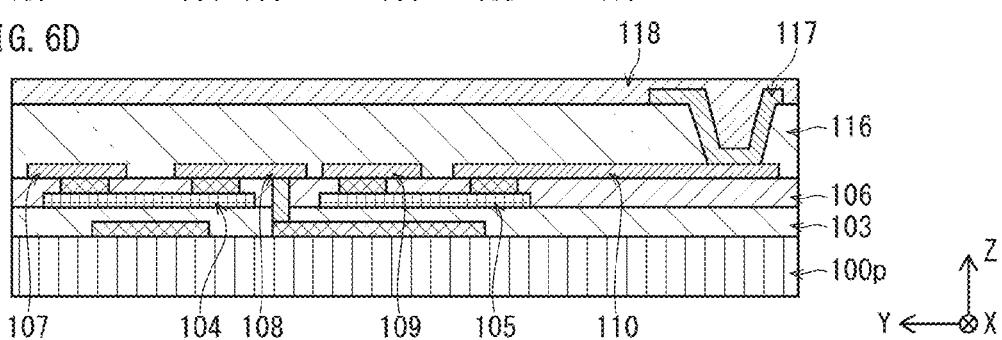

Subsequently, as illustrated in FIG. 6D, the connecting electrode layers 117 are formed conforming to the contours of the side walls of the contact holes 116a in the passivation layer 116. Upper portions of the connecting electrode layers 117 are disposed on the passivation layer 116. Sputtering may be used to forming the connecting electrode layers 117, for example. After forming a metal film, patterning is performed by using photolithography and wet etching.

Further, the interlayer insulating layer 118 is formed covering the connecting electrode layers 117 and the passivation layer 116, by applying the organic material and planarizing the surface thereof.

(2) Forming Pixel Electrode Layers 119

Figure 6E:
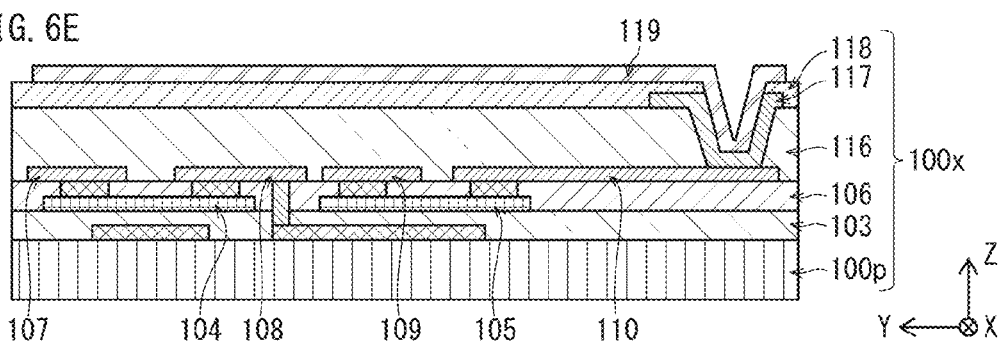

As illustrated in FIG. 6E, contact holes are opened in the interlayer insulating layer 118 above the connecting electrode layers 117, and the pixel electrode layers 119 are formed.

Forming the pixel electrode layers 119 comprises forming a metal film by using a method such as sputtering or vacuum deposition, followed by patterning by using photolithography and etching. The pixel electrode layers 119 are electrically connected to the connecting electrode layers 117.

(3) Forming Hole Injection Layers 120 and Banks 122

As illustrated in FIG. 7A, the hole injection layers 120 and the hole transport layers 121 are formed on the pixel electrode layers 119 and the banks 122 are formed covering edge portions of the hole transport layers 121. The banks 122 surround the openings 122a that define pixels, surfaces of the hole transport layers 121 being exposed by the openings 122a.

The hole injection layers 120 and the hole transport layers 121 are formed by forming films from a metal oxide (for example, tungsten oxide) by using sputtering, then patterning to each pixel by using photolithography and etching.

The banks 122 are formed by first forming a layer composed of a bank 122 material (for example, a photosensitive resin material) on the hole transport layers 121 by using a spin coating method or similar. Subsequently, the resin layer is patterned to form the openings 122a. Forming the openings 122a includes arranging a mask above the resin layer, exposure to light, and developing.

(4) Forming Light-Emitting Layers 123 and Electron Transport Layer 124

As illustrated in FIG. 7B, from the hole transport layers 121 in the openings 122a defined by the banks 122, the light-emitting layers 123 and the electron transport layer 124 are formed in this order.

Forming the light-emitting layers 123 includes applying ink that contains component material into the openings 122a defined by the banks 122, and subsequently baking.

The electron transport layer 124 is formed by sputtering or similar.

(5) Forming Opposing Electrode Layer 125 and Sealing Layer 126

As illustrated in FIG. 7C, the opposing electrode layer 125 and the sealing layer 126 are formed in this order, covering the electron transport layer 124.

The opposing electrode layer 125 and the sealing layer 126 are formed by using CVD or sputtering, for example.

(6) Forming CF Substrate 131

The following describes a process of manufacturing the CF substrate 131, with reference to drawings from FIG. 8A to FIG. 8F.

Figure 8A:
FIG. 8A, FIG. 8B, FIG. 8C, FIG. 8D, FIG. 8E, and FIG. 8F are schematic cross-sectional views illustrating states of processes in manufacturing the organic EL display panel 10.

Material of the light-shielding layer 129, including an ultraviolet-curable resin (for example, an ultraviolet-curable acrylic resin) as a primary component and a black pigment added thereto is dispersed in a solvent, adjusted to a light-shielding layer paste 129X, and applied to one surface of the upper substrate 130, which is light-transmissive (FIG. 8A).

Figure 8B:
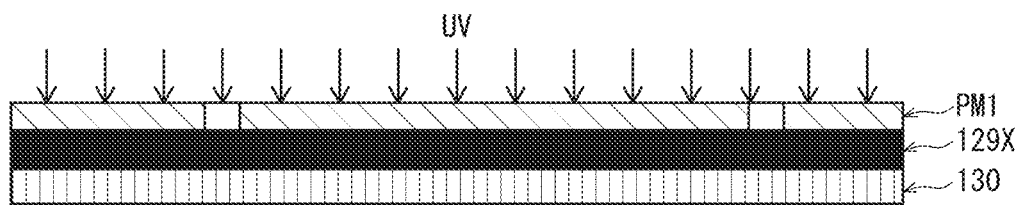

After application, the light-shielding layer paste 129X is dried, and after the solvent has to some extent vaporized a pattern mask PM1 that has predefined openings is overlaid on the light-shielding layer paste 129X and irradiated with ultraviolet light from above (FIG. 8B).

Figure 8C:
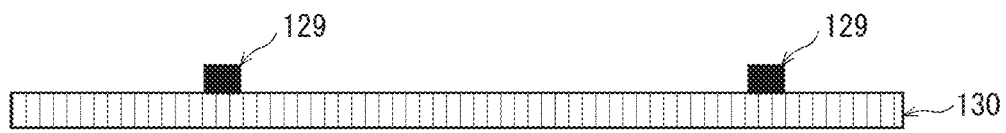

Subsequently, the light-shielding layer paste 129X is baked, the pattern mask PM1 and uncured BM paste 120X are removed and developed, and, when cured, the light-shielding layer 129 that is rectangular in cross-section is completed (FIG. 8C).

Subsequently, a paste 129X is applied on a surface of the upper substrate 130 on which the light-shielding layer 129 is complete. The paste 128X is material of the color filter layers 128, a primary component of which is ultraviolet-curable resin, dispersed in a solvent. After application, an amount of the solvent is removed, and a predefined pattern mask PM2 is overlaid thereon and irradiated with ultraviolet light (FIG. 8D).

Figure 8D:
Figure 8E:
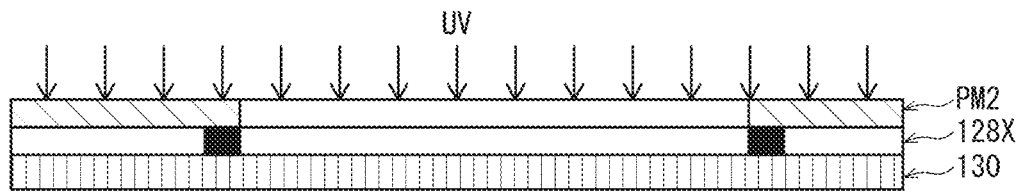
Figure 8F:
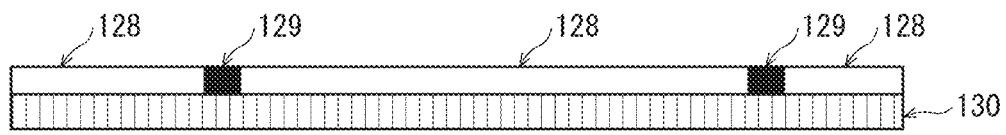

Subsequently curing is performed, the pattern mask PM2 and uncured paste 128X are removed and developed to form color filter layers 128(G) (FIG. 8E).

The processes of FIG. 8D and FIG. 8E are repeated for color filter materials of each color to form color filter layers 128(R) and color filter layers 128(B). Instead of using the paste 128X, a commercial color filter product may be used.

Thus, the CF substrate 131 is formed.

(7) Attachment of CF Substrate 131 and Rear Panel

Figure 9A:
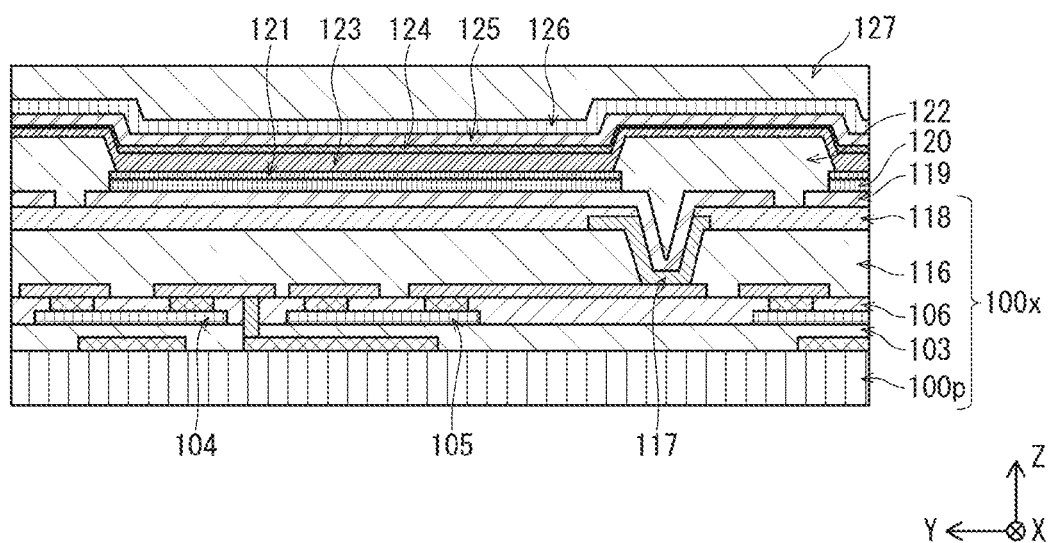
FIG. 9A and FIG. 9B are schematic cross-sectional views illustrating states of processes in manufacturing the organic EL display panel 10.

Subsequently, material of the joining layer 127, which is primarily a light-transmissive ultraviolet-curable resin such as acrylic resin, silicone resin, or epoxy resin, is applied to a rear panel, which consists of each layer from the substrate 100x to the sealing layer 126 (FIG. 9A).

Figure 9B:
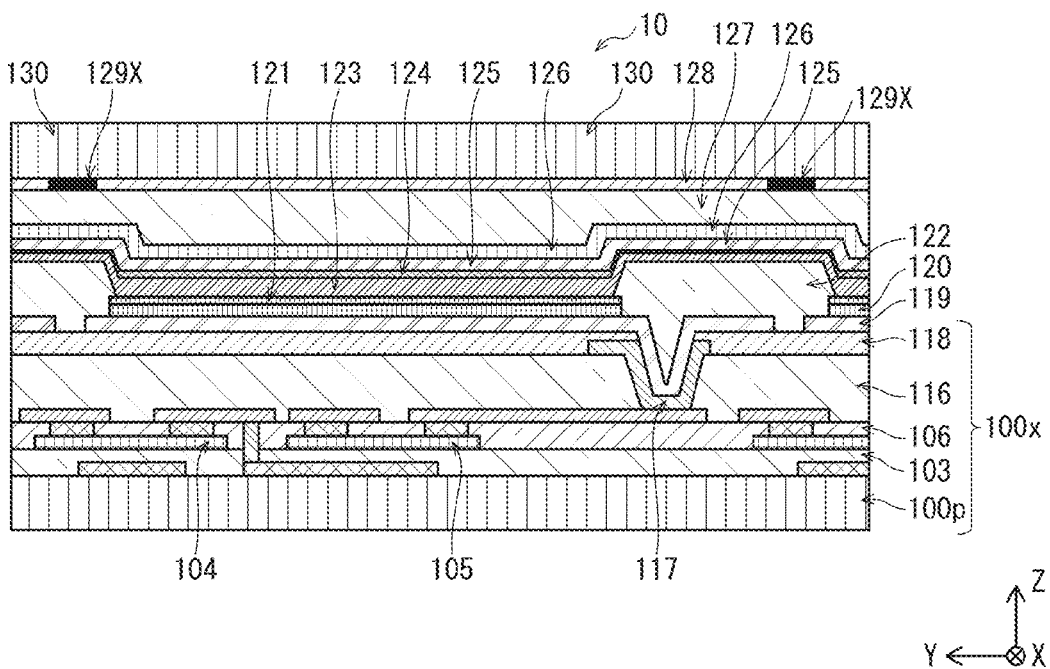

Subsequently, the applied material is irradiated by ultraviolet light and the rear panel and the CF substrate 131 are then bonded to each other, maintaining their positional relationship with each other. At this time, care is taken to ensure that no gas enters between the rear panel and the CF substrate 131. Subsequently, both substrates are baked and sealed, completing the organic EL display panel 1 (FIG. 9B).

6. Effects of Display Panel 10

6.1 Improved Light Emission Efficiency

Figure 10:
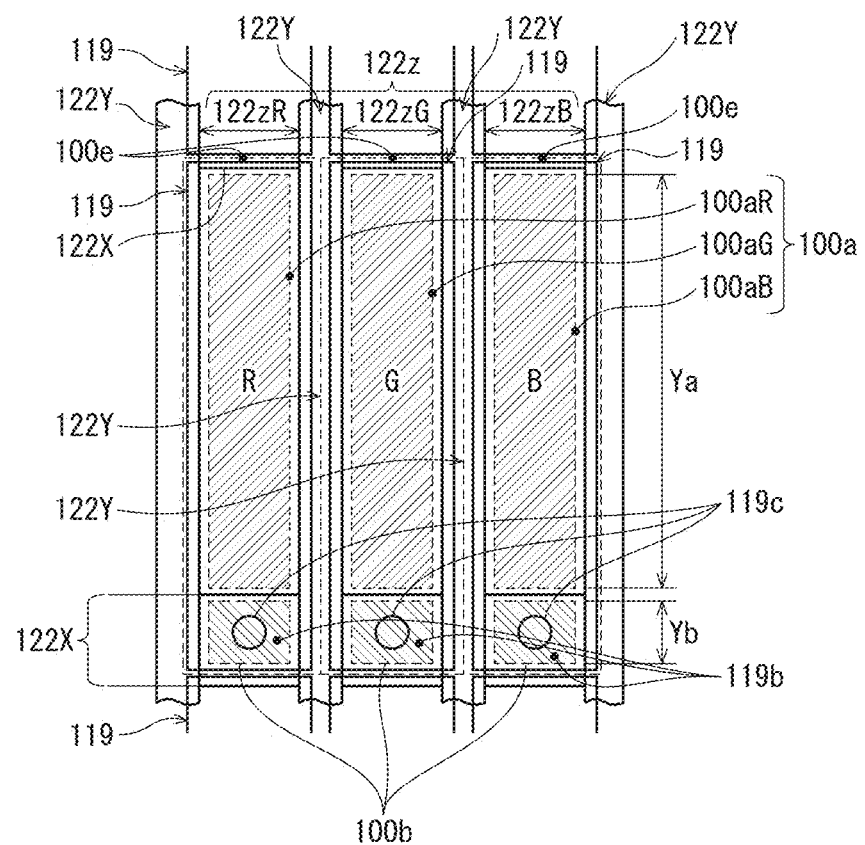
FIG. 10 is an enlarged plan view of a portion A in FIG. 3.

FIG. 10 is an enlarged plan view of a portion A in FIG. 3. In the organic EL elements 100, the self-luminous regions 100a and the not-self-luminous regions 100b are arranged alternating with each other in the column direction. The row light-shielding layers 129X, as shown in FIG. 4, are disposed in positions that do not overlap with portions of the contact regions 119b.

As above, according to the organic EL elements 100, only portions of the light-emitting layers 123 that are supplied carriers from the pixel electrode layers 119 emit light, and in the not-self-luminous regions 100b where the row banks 122X are present, which are inter-layer insulators, electroluminescence of organic compounds does not occur. However, light emitted from the self-luminous regions 100a of the light-emitting layers 123 is partially transmitted in all directions within the light-emitting layers 123, and therefore light that leaks in the column direction from the light-emitting layers 123 is transmitted into the row banks 122X that are adjacent, into the not-self-luminous regions 100b. A portion of such light is reflected upwards at the contact regions 119b of the pixel electrode layers 119 in the not-self-luminous regions 100b.

Thus, by arranging the row light-shielding layers 129X in positions that do not overlap with the contact regions 119b in the not-self-luminous regions 100b, while avoiding being above the pixel electrode layers 119, light that leaks in the column direction from the light-emitting layers 123 can be emitted upwards in the not-self-luminous regions 100b, improving light emission efficiency of the organic EL elements 100.

6.2 Suppressing Glare on Display Panel Surface Caused by Glare from External Light According to the organic EL elements 100, the column light-shielding layers 129Y, as shown in FIG. 5, are disposed in positions overlapping the row-direction edge portions 119a3, 119a4 of the pixel electrode layers 119, and the row light-shielding layers 129X, as shown in FIG. 4, are disposed in positions overlapping the column-direction edge portions 119a1, 119a2 of the pixel electrode layers 119.

According to investigation by the inventors, upper surfaces of the pixel electrode layers 119 are smooth because they are formed by a process such as sputtering or vacuum deposition, and external light glare from upper surfaces other than the edge portions 119a of the pixel electrode layers 119 is not as visible as from the edge portions 119a. In contrast, the edge portions 119a of the pixel electrode layers 119 are formed by patterning by etching, and therefore edge surfaces of the edge portions 119a are rougher than the upper surfaces and the edge surfaces become inclined away from the vertical to form trapezoidal shapes. Thus, irregular reflection occurs when external light is incident on the edge portions 119a of the pixel electrode layers 119, which are finely patterned in all directions as internal surfaces of the display panel. Light reflected in all directions that is incident on the eyes of an observer is recognized as glare on the surface of the display panel, and becomes a factor in degradation of quality of a displayed image.

According to the organic EL elements 100, the light-shielding layer 129 is disposed above the edge portions 119a of the pixel electrode layers 119, and therefore can prevent direct incidence of external light on the edge portions 119a of the pixel electrode layers 119 as well as interrupt emission of light reflected at the edge portions 119a. Thus, external light glare on the display panel 10 is effectively suppressed.

Further, even when the row light-shielding layers 129X are not above portions of the not-self-luminous regions 100b, light reflected from the edge portions 119a of the pixel electrode layer 119, which is most noticeable, is shielded by disposing the light-shielding layer 129 that includes the row light-shielding layers 129X above the edge portions 119a of the pixel electrode layers 119, and therefore external light glare does not become a problem.

6.3 Other

As described above, the light-shielding layer 129 has a function of preventing boundaries between pixels becoming unclear by blocking a portion of light emitted from a pixel that leaks to adjacent pixels, and has a function of increasing color purity of light emitted from pixels.

According to the organic EL elements 100, the width WX in the row direction of the column light-shielding layers 129Y is greater than the distance δX in the row direction between adjacent ones of the pixel electrode layers 119, and the width WY in the column direction of the row light-shielding layers 129X is greater than the distance δY in the column direction between adjacent ones of the pixel electrode layers 119. The distance δX and the distance δY between the pixel electrode layers 119 are determined by the accuracy of etching in a manufacturing process of patterning the pixel electrode layers 119, and are equivalent to each other.

Thus, the width WX in the row direction of the column light-shielding layers 129Y and the width WY in the column direction of the row light-shielding layers 129X can be made equivalent to each other, and therefore a decrease in color purity of light emitted from pixels does not occur when the decrease in color purity would be caused by color mixing between adjacent pixels when pixel boundaries become unclear as a result of emitted light leaking to adjacent pixels when the row light-shielding layers 129X are not above portions of the not-self-luminous regions 100b.

6.4 Lighting Test

Lighting tests were performed on the display panel 10 incorporating the organic EL elements 100 and luminance was measured.

Figure 11A:
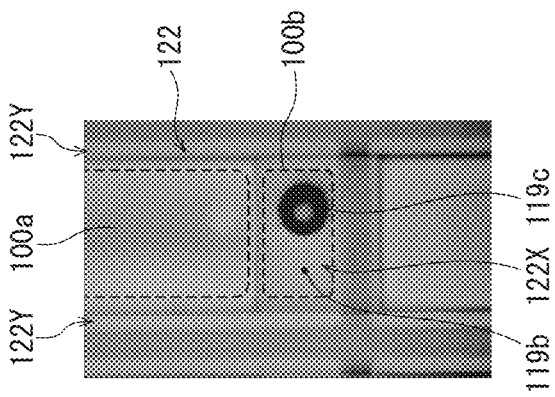
FIG. 11A, FIG. 11B, and FIG. 11C are plan view photographs of the pixel 100e of the organic EL display panel 10, captured from above an upper substrate 130.
Figure 11B:
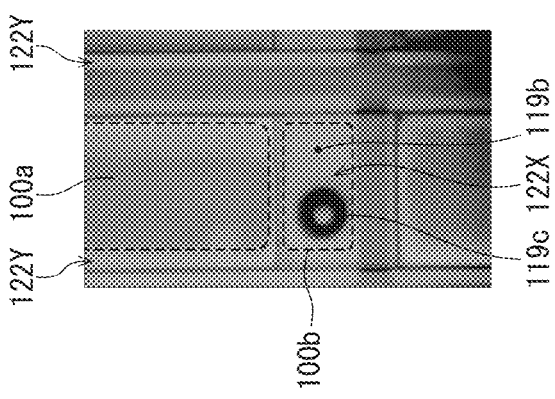
Figure 11C:
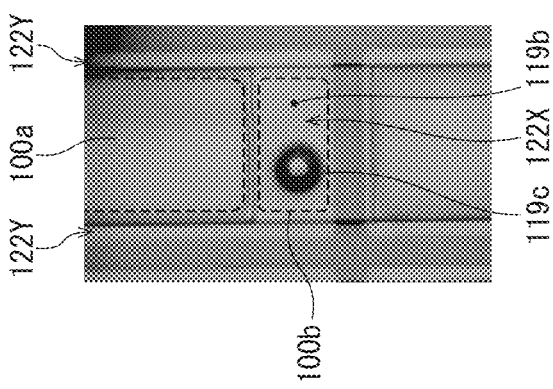

FIG. 11A, FIG. 11B, and FIG. 11C are photographs captured from above the upper substrate 130, showing the pixels 100e of the display panel 10 in plan view. FIG. 11A shows one of the self-luminous regions 100a and one of the not-self-luminous regions 100b of one of the organic EL elements 100 in one of the red intervals 122zR, FIG. 11B shows one of the green intervals 122zG, and FIG. 11C shows one of the blue intervals 122zB.

Figure 12A:
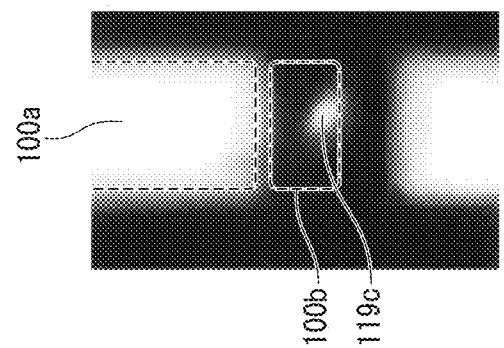
FIG. 12A, FIG. 12B, and FIG. 12C are plan view photographs of the pixel 100e of the organic EL display panel when emitting light, captured from above the upper substrate.
Figure 12B:
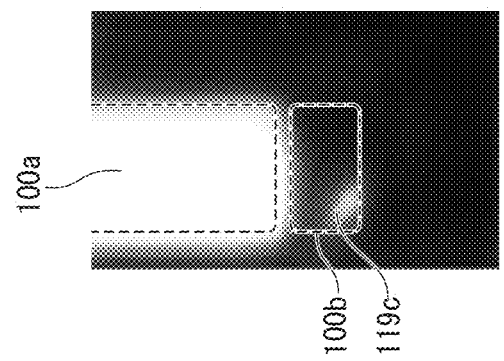
Figure 12C:
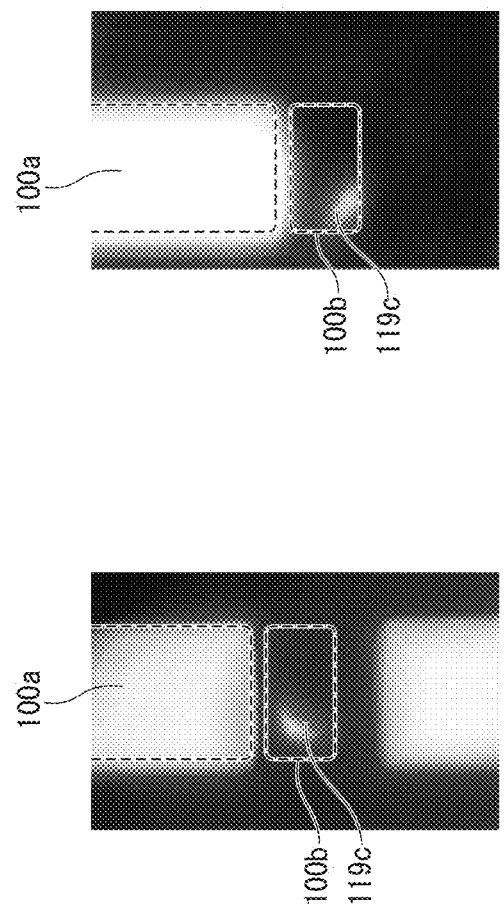

FIG. 12A, FIG. 12B, and FIG. 12C are photographs captured from above the upper substrate 130, showing the pixels 100e of the display panel 10 in plan view. FIG. 12A, FIG. 12B, and FIG. 12C show the same pixels shown in FIG. 11A, FIG. 11B, and FIG. 11C, in a state of emitting light. In each of the red intervals 122zR, the green intervals 122zG, and the blue intervals 122zB, it was confirmed that a small amount of luminance was obtained from the not-self-luminous regions 100b. Luminance per unit area of the not-self-luminous regions 100b of each of the intervals was approximately 8% of luminance per unit area of the self-luminous regions 100a of the same intervals. According to the present embodiment, for each interval, the area of the not-self-luminous region 100b is approximately 20% of the area of the self-luminous region 100a, and therefore an increase in luminance of approximately 1.6% (0.2×0.08) was confirmed over a conventional configuration for which light is extracted from only the self-luminous region 100a. When viewed quantitatively, this is considered to be a sufficiently significant amount for a rate of improvement in element levels of luminance.

Further, according to FIG. 12A, FIG. 12B, and FIG. 12C, a significant increase in luminance can be seen in the connecting recesses 119c on the pixel electrode layers 119 in the not-self-luminous regions 100b when compared with peripheral regions. As above, the connecting recesses 119c are concavities in portions of the pixel electrode layers 119, recessed towards the substrate 100x, composed of bottom portions 119c1 and inner peripheral surface portions 119c2. Surfaces of the inner peripheral surface portions 119c2 are conical inclined slopes. Thus, lights that leaks in the column direction from the light-emitting layers 123 is thought to have been effectively reflected upwards towards the not-self-luminous regions 100b.

Accordingly, it is preferable that, in plan view of the substrate 100x, the row light-shielding layers 129X do not overlap with the connecting recesses 119c of the pixel electrode layers 119, which are for connecting thin film transistor sources and the pixel electrode layers 119.

<Modifications>

The Embodiment describes the display panel 10 pertaining to the present embodiment, but the present invention is not limited to the embodiment described above, except for essential characteristic features thereof. For example, configurations obtained by applying various modifications that could occur to a person having ordinary skill in the art or configurations of the embodiment implementing any combination of components and functions that do not depart from the scope of the present invention are included in the scope of the present invention. The following describes modifications of the display panel 10 as examples of such configurations.

(1) According to the display panel 10 pertaining to the embodiment, the CF substrate 131 including the row light-shielding layers 129X and the column light-shielding layers 129Y is disposed on and attached to the rear panel that comprises each layer from the substrate 100x to the sealing layer 126. However, according to the display panel 10 exemplified here, the row light-shielding layers 129X and the column light-shielding layers 129Y may be directly disposed on the rear panel.

Figure 13:
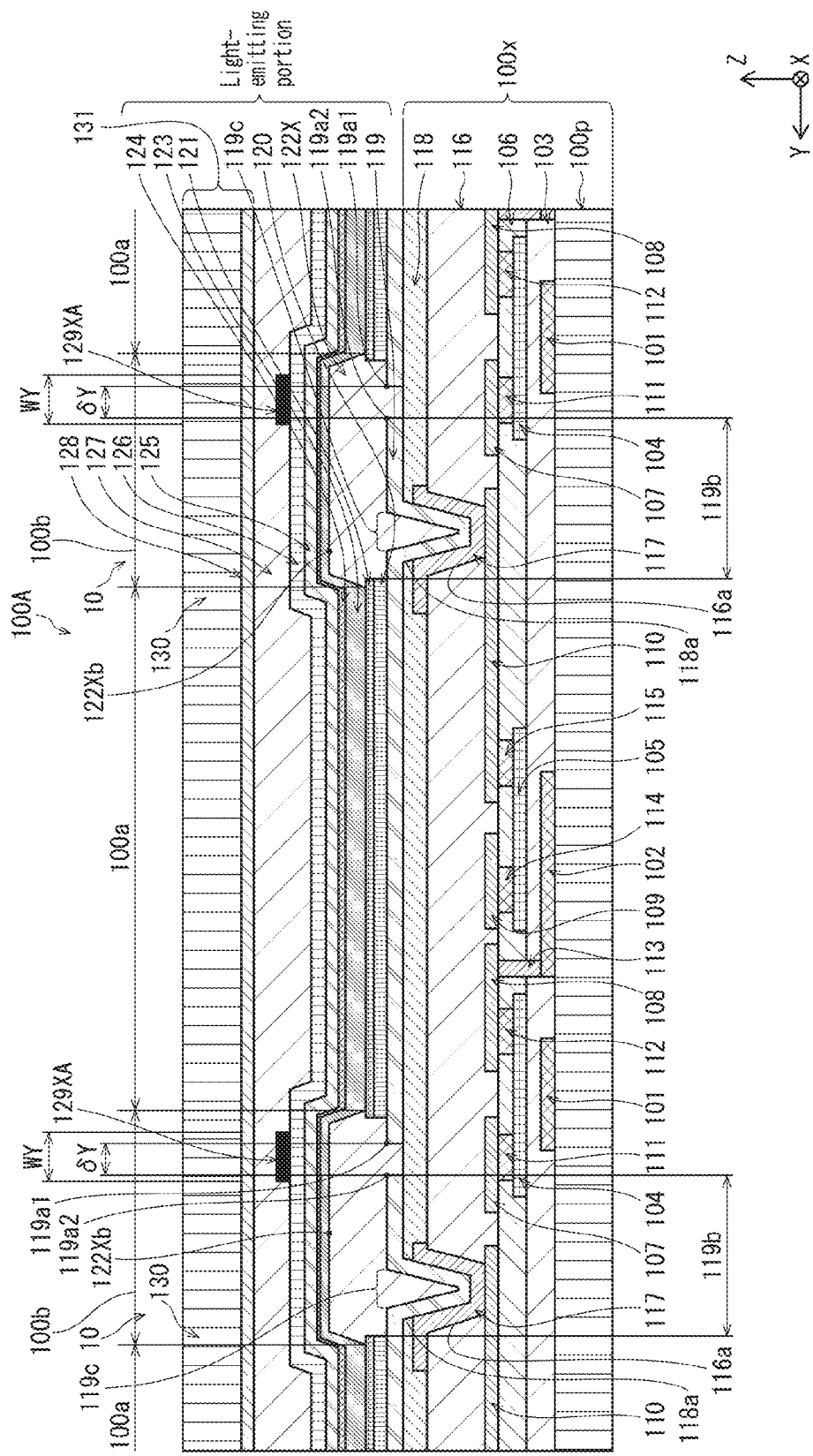
FIG. 13 is a schematic cross-sectional view at the same position as A-A in FIG. 3, of an organic EL display panel 10A pertaining to a modification.
Figure 14:
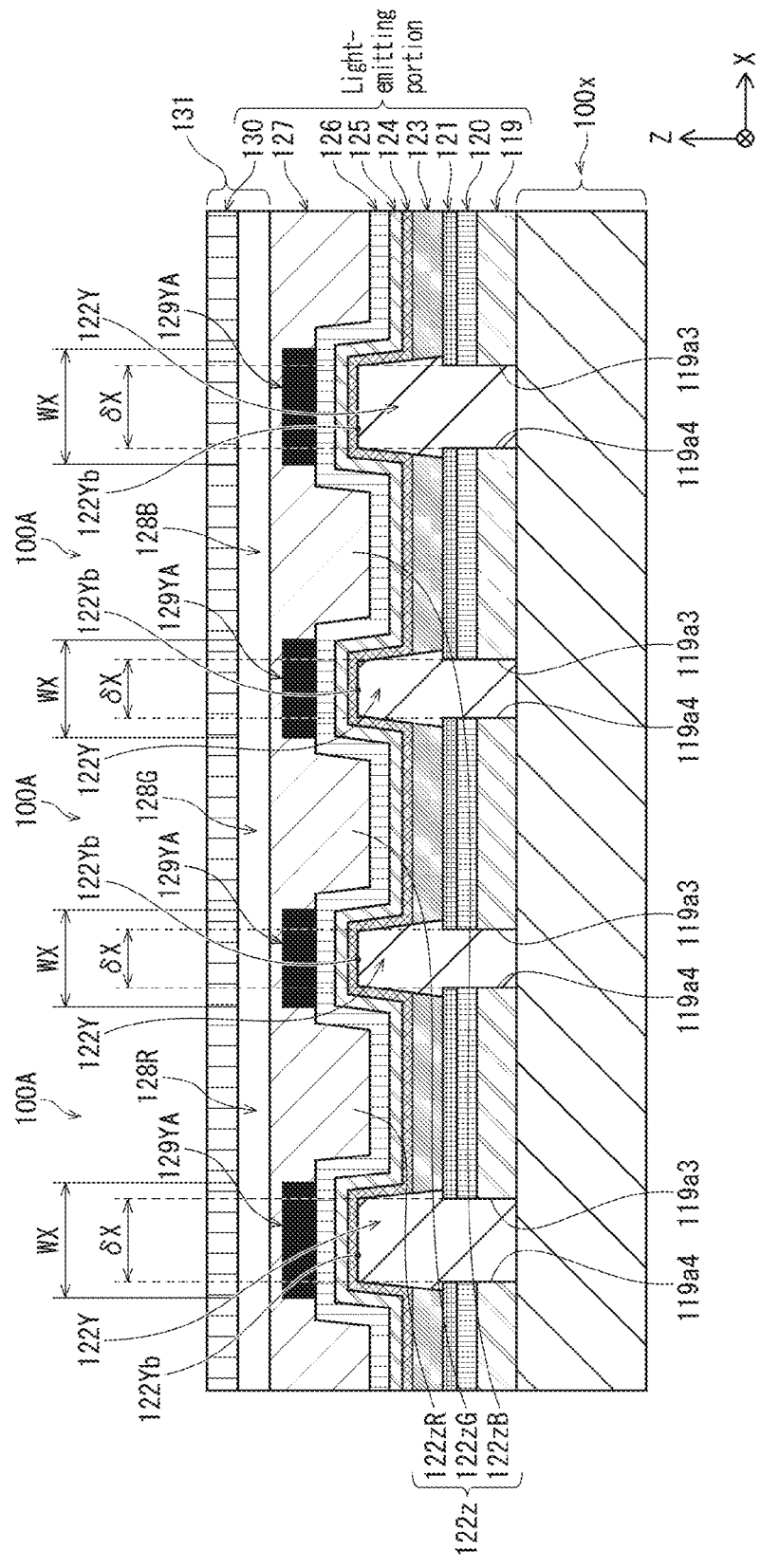
FIG. 14 is a schematic cross-sectional view at the same position as B-B in FIG. 3, of an organic EL display panel 10A pertaining to a modification.

FIG. 13 and FIG. 14 are schematic cross-sectional views at the same positions as A-A and B-B in FIG. 3, of an organic EL display panel 10A pertaining to this modification. As shown in FIG. 13 and FIG. 14, in organic EL elements 100A pertaining to this modification, the row light-shielding layers 129X and the column light-shielding layers 129Y are not formed on the upper substrate 130. Light-shielding layers 129YA are disposed on the sealing layer 126 above peaks 122Yb of the column banks 122Y, extending in the column direction. Light-shielding layers 129XA are disposed on the sealing layer 126 above peaks 122Xb of the row banks 122X, extending in the row direction.

According to Modification 1, as with the embodiment, the light-shielding layers 129XA and the light-shielding layers 129YA are disposed above peripheral portions of the pixel electrode layers 119, and therefore glare from external light is suppressed. Further, by arranging the light-shielding layers 129XA in positions that do not overlap with the contact regions 119b in the not-self-luminous regions 100b, while avoiding being above the pixel electrode layers 119, light that leaks in the column direction from the light-emitting layers 123 can be emitted upwards in the not-self-luminous regions 100b, improving light emission efficiency of the organic EL elements 100A.

Further, according to this modification, high-precision positional adjustment for aligning the pixels of the rear panel and the light-shielding layer 129 of the CF substrate 131 with each other is not required. In particular, alignment between the rear panel and the CF substrate 131 can be eliminated in a configuration in which the color filter layers 128, which are different colors for different pixels, are not disposed in the CF substrate 131. Further, according to this modification, the display panel 10A achieves suppression of glare from external light and improves light emission efficiency even in a configuration that does not include the CF substrate 131, such as a transparent display.

Further, in a configuration in which the upper substrate 130, composed of light-transmissive material, is disposed above the opposing electrode layer 125, the row light-shielding layers 129X may be disposed on the upper substrate 130 and the light-shielding layers 129YA disposed on upper surfaces of the column banks 122Y. Alternatively, the column light-shielding layers 129Y may be disposed on the upper substrate 130 and the light-shielding layers 129XA disposed on upper surfaces of the row banks 122X. Thus, in addition to suppression of glare from external light and improvement of light emission efficiency, manufacturing cost can be reduced. According to this configuration, the row light-shielding layers 129X or the column light-shielding layers 129Y form stripes on the upper substrate 130, and therefore, for example, die coating can be used to apply paste for the row light-shielding layers 129X or the column light-shielding layers 129Y onto the upper substrate 130, which is then baked to manufacture light-shielding layers. Thus, the processes according to the embodiment described above, in which light-shielding layer paste applied onto the upper substrate 130 is exposed to ultraviolet light through the pattern mask PM1, become unnecessary.

(2) According to the display panel 10, the light-emitting layers 123 extend continuously in the column direction above the row banks. However, the light-emitting layers 123 may be interrupted above the row banks to form discrete pixels. This configuration also suppresses glare from external light and improves light emission efficiency.

(3) According to the display panel 10, any two of the light-emitting layers 123 disposed in the intervals 122z between the column banks 122Y that are adjacent to each other in the row direction emit different colors of light from each other and any two of the light-emitting layers 123 disposed in the intervals 122z between the row banks 122X that are adjacent to each other in the column direction emit the same color of light. However, any two of the light-emitting layers 123 that are adjacent to each other in the row direction may emit the same color of light and any two of the light-emitting layers 123 that are adjacent to each other in the column direction may emit different colors of light from each other. Further, any of the light-emitting layers 123 that are adjacent to each other in the row direction and/or the column direction may emit different colors of light from each other. This configuration also suppresses glare from external light and improves light emission efficiency. Further, loss of clarity due to light emitted from pixels leaking into adjacent pixels does not occur and a decrease in color purity of light emitted from pixels caused by color mixing between adjacent pixels does not occur.

(4) According to the display panel 10, the CF substrate 131 is, via the joining layer 127, disposed on and attached to the rear panel that comprises each layer from the substrate 100x to the sealing layer 126. Further, photo spacers may be disposed between the rear panel and the CF substrate 131.

The photo spacers (not illustrated) are primarily used for the purpose of adjusting spacing between the CF substrate 131 and the rear panel. For example, the photo spacers may each have a cylindrical shape with an axis along the Z direction, each end of the cylindrical shape in the Z axis direction being in direct contact with the CF substrate 131 or the rear panel. The photo spacers are not limited to being cylindrical shapes and may be rectangular solids, spheres, etc., and may be elongated shapes like the light-shielding layers 129XA or the light-shielding layers 129YA. When the photo spacers have elongated shapes along the XY plane, an effect for each organic EL element of preventing light entering adjacent ones of the light-emitting layers 123 can be achieved. A known material can be used as material of the photo spacers, exemplified by a high transparency resin material such as a methacrylic acid ester. The photo spacers may be disposed at the intersections between the light-shielding layers 129XA and the light-shielding layers 129YA in each pixel, but are not limited to this disposition. For example, the photo spacers may be disposed at intersections of pixels in a color display comprising sets of three colors of the color filter layers 128.

(5) Other Modifications.

According to the display panel 10 pertaining to the embodiment there are three colors of the pixels 100e—red pixels, green pixels, and blue pixels—but the present invention is not limited to this. For example, one type of light-emitting layer may be used, or four types of light-emitting layer emitting red, green, blue, and yellow light may be used.

Further, according to the embodiment, the pixels 100e are arranged in a matrix, but the present invention is not limited to this. For example, when the interval of pixel regions is one pitch, adjacent pixel regions may be shifted by a half pitch in the column direction. In a high-definition display panel, shifting in the column direction becomes difficult to determine by visual inspection and for straight lines (or zigzags) of a certain width, even irregularity in film thickness is perceived as being regular. Accordingly, variation in luminance can be suppressed by a zigzag alignment, improving display quality of the display panel.

Further, according to the display panel 10, the pixel electrode layers 119 are disposed in all of the intervals 122z, but the present invention is not limited to this configuration. For example, when a bus bar or similar is present, intervals 122z in which the pixel electrode layers 119 are not present may exist.

Further, according to the display panel 10, the color filter layers 128 are formed above the intervals 122z of the pixels 100e of each color. However, the display panel 10 may be configured without the color filter layers 128 above the intervals 122z.

Further, according to the embodiment, the hole injection layers 120, the hole transport layers 121, the light-emitting layers 123, and the electron transport layer 124 are formed between the pixel electrode layers 119 and the opposing electrode layer 125, but the present invention is not limited to this. For example, a configuration may be used in which only the light-emitting layers 123 are between the pixel electrode layers 119 and the opposing electrode layer 125, without using the hole injection layers 120, the hole transport layers 121, or the electron transport layer 124. Further, for example, a configuration may include hole injection layers, hole transport layers, an electron transport layer, an electron injection layer, or some or all of these. Further, these layers need not all be composed of organic compounds, and may be composed of inorganic materials, etc.

Further, according to the embodiment, as methods of forming the light-emitting layers 123, wet processes such as printing, spin coating, and inkjets are used, but the present invention is not limited to these. For example, dry processes such as vacuum deposition, electron beam deposition, sputtering, reactive sputtering, ion plating, and vapor phase growth may be used. Further, known materials may be appropriately applied as materials of each element.

According to the embodiment, the pixel electrode layers 119, which are anodes, are disposed in lower portions of EL elements and TFT source electrodes 110 are connected to the pixel electrode layers 119. However, a configuration may be applied in which the opposing electrode layer may be disposed in the lower portions of the EL elements and an anode disposed at the upper portions. In this case, the drains of the TFT are connected to the cathode disposed in the lower portion.

Further, according to the embodiment, a configuration is used in which two transistors Tr1, Tr2 are supplied for each of the pixels 100e, but the present invention is not limited to this. For example, a configuration may be used in which one transistor is supplied for each sub-pixel, or three or more transistors are supplied for each sub-pixel.

Further, according to the embodiment, a top-emission type of EL display panel is given as one example, but the present invention is not limited to this. For example, a bottom-emission type of display panel may be used. In such cases each configuration may be modified as appropriate.

Further, according to the embodiment, the display panel 10 is an active matrix, but the present invention is not limited in this way. For example, a passive matrix may be used. More specifically, straight line electrodes parallel to the column direction and straight line electrodes parallel to the row direction may surround the light-emitting layers 123. In such cases each configuration may be modified as appropriate. According to the embodiment, the substrate 100x includes a TFT layer but as described above in the example of a passive matrix, the substrate 100x may be configured without a TFT layer.

<<Review>>

The organic EL display panel pertaining to the present embodiment is an organic EL display panel in which a plurality of pixels are arranged in a row direction and a column direction in a matrix, the organic EL display panel including: a substrate 100x; a plurality of pixel electrode layers 119 arranged in the row direction and the column direction in a matrix on the substrate 100x, the pixel electrode layers 119 including a light-reflective material; a plurality of column banks 122Y disposed on the substrate 100x and on the pixel electrode layers 119, covering row-direction edge portions 119a3, 119a4 of the pixel electrode layers 119, extending in the column direction, arranged side-by-side in the row direction, and defining row-direction edges of self-luminous regions 100a of the pixels; a plurality of row banks 122X disposed on the substrate 100x and on the pixel electrode layers 119, covering column-direction edge portions 119a1, 119a2 of the pixel electrode layers 119 and contact regions 119b of the pixel electrode layers 119 that are for electrically connecting the pixel electrode layers 119, extending in the row direction, arranged side-by-side in the column direction, and defining column-direction edges of the self-luminous regions 100a; a plurality of light-emitting layers 123 disposed above the pixel electrode layers 119 in intervals 122Z between adjacent ones of the column banks 122Y; an opposing electrode layer 125 disposed above the light-emitting layers 123, the opposing electrode layer 125 including a light-transmissive material; a plurality of column light-shielding layers 129Y disposed higher than the pixel electrode layers 119, extending in the column direction, arranged side-by-side in the row direction, and overlapping the row-direction edge portions 119a3, 119a4 of the pixel electrode layers 119 in plan view of the substrate 100x; and a plurality of row light-shielding layers 129X disposed higher than the pixel electrode layers 119, extending in the row direction, arranged side-by-side in the column direction, overlapping the column-direction edge portions 119a1, 119a2 of the pixel electrode layers 119 and partially overlapping the contact regions 119b in plan view of the substrate 100x.

According to this configuration, an organic EL element that improves suppression of glare from external light on a display surface and improves light emission efficiency and an organic EL display panel using the organic EL element can be provided.

<Supplement>

The embodiment described above represents one preferred example of the present invention. Values, shapes, materials, components, component positions and connections, processes, process sequences, etc., exemplified by the embodiment are all examples, and are not intended to limit the present invention. Further, elements of the embodiment that are not recited in independent claims that represent topmost concepts of the present invention are described as optional elements constituting a preferred embodiment.

Further, the sequence in which processes are described as being executed is an illustrative example for describing the present invention, and sequences other than those described may be used. Further, a portion of the processes described may be executed simultaneously (in parallel) with another process or other processes.

Further, in order to aid understanding of the invention, the scale of elements in the drawings referenced by the embodiment may differ from actual implementation. Further, the present invention is not limited to the description of the embodiment and may be modified appropriately without departing from the scope of the present invention.

Further, at least a portion of the functionality of the embodiment and the modifications may be combined.

Further, various modifications to the embodiment that may occur to a person having ordinary skill in the art are also included in the scope of the present invention.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

The invention claimed is:

1. An organic EL display panel in which a plurality of pixels are arranged in a row direction and a column direction in a matrix, the organic EL display panel comprising:
   a substrate;
   a plurality of pixel electrode layers arranged in the row direction and the column direction in a matrix on the substrate, the pixel electrode layers including a light-reflective material;
   a plurality of column banks disposed on the substrate and on the pixel electrode layers, covering row-direction edge portions of the pixel electrode layers, extending in the column direction, arranged side-by-side in the row direction, and defining row-direction edges of self-luminous regions of the pixels;
   a plurality of row banks disposed on the substrate and on the pixel electrode layers, covering column-direction edge portions of the pixel electrode layers and contact regions of the pixel electrode layers that are for electrically connecting the pixel electrode layers, extending in the row direction, arranged side-by-side in the column direction, and defining column-direction edges of the self-luminous regions;
   a plurality of light-emitting layers disposed above the pixel electrode layers in intervals between adjacent ones of the column banks;
   an opposing electrode layer disposed above the light-emitting layers, the opposing electrode layer including a light-transmissive material;
   a plurality of column light-shielding layers disposed higher than the pixel electrode layers, extending in the column direction, arranged side-by-side in the row direction, and overlapping the row-direction edge portions of the pixel electrode layers in a plan view of the substrate; and
   a plurality of row light-shielding layers disposed higher than the pixel electrode layers, extending in the row direction, arranged side-by-side in the column direction, overlapping the column-direction edge portions of the pixel electrode layers and partially overlapping the contact regions in the plan view of the substrate.

2. The organic EL display panel of claim 1, further comprising:
   a plurality of thin-film transistors arranged in the row direction and the column direction in a matrix in the substrate, in positions corresponding to the pixels, wherein
   sources or drains of the thin-film transistors are connected to the pixel electrode layers via connecting recesses in which portions of the pixel electrode layers in the contact regions are recessed in a direction of the substrate, and
   in the plan view of the substrate, the row light-shielding layers do not overlap with the connecting recesses.

3. The organic EL display panel of claim 1, wherein the light-emitting layers extend continuously in the column direction above the row banks.

4. The organic EL display panel of claim 1, wherein the light-emitting layers are interrupted by the row banks.

5. The organic EL display panel of claim 1, wherein
any two of the light-emitting layers disposed in the intervals between the column banks that are adjacent to each other in the row direction emit different colors of light from each other.

6. The organic EL display panel of claim 4, wherein
any one of the light-emitting layers interrupted by the row banks in the column direction emits a same color of light along a length in the column direction.

7. The organic EL display panel of claim 1, further comprising:
an upper substrate disposed above the opposing electrode, the upper substrate including a light-transmissive material, wherein
the row light-shielding layers, the column light-shielding layers, or both the row light-shielding layers and the column light-shielding layers are disposed in direct contact with the upper substrate.

8. The organic EL display panel of claim 1, wherein
the column light-shielding layers are disposed on upper surfaces of the column banks.

9. The organic EL display panel of claim 1, wherein
the row light-shielding layers are disposed on upper surfaces of the row banks.

10. An organic EL element, comprising:
a substrate;
a thin film transistor disposed in the substrate;
a pixel electrode layer disposed on the substrate, the pixel electrode layer including a light-reflective material;
banks disposed on the substrate and on the pixel electrode layer, covering edge portions of the pixel electrode layer and a portion of a contact region of the pixel electrode layer, the contact region being for electrically connecting the pixel electrode layer;
a light-emitting layer disposed above the pixel electrode layer;
an opposing electrode layer disposed above the light-emitting layer, the opposing electrode layer including a light-transmissive material; and
a light-shielding layer disposed higher than the pixel electrode layer, the light-shielding layer overlapping the edge portions of the pixel electrode layers and partially overlapping the contact region in a plan view of the substrate, wherein
a source or a drain of the thin-film transistor is connected to the pixel electrode layer via a connecting recess in which a portion of the pixel electrode layer in the contact region is recessed in a direction of the substrate, and
in the plan view of the substrate, the light-shielding layer does not overlap with the connecting recess.

11. A method of manufacturing an organic EL display panel, the method comprising:
preparing a substrate;
disposing a plurality of pixel electrode layers in a row direction and a column direction in a matrix on the substrate, the pixel electrode layers including a light-reflective material;
disposing a plurality of column banks on the substrate and on the pixel electrode layers, the column banks covering row-direction edge portions of the pixel electrode layers, extending in the column direction, and arranged side-by-side in the row direction;
disposing a plurality of row banks on the substrate and on the pixel electrode layers, the row banks covering column-direction edge portions of the pixel electrode layers, extending in the row direction, and arranged side-by-side in the column direction;
disposing a plurality of light-emitting layers above the pixel electrode layers in intervals between adjacent ones of the column banks;
disposing an opposing electrode layer above the light-emitting layers, the opposing electrode layer including a light-transmissive material;
disposing, higher than the pixel electrode layers, a plurality of column light-shielding layers extending in the column direction, arranged side-by-side in the row direction, and overlapping the row-direction edge portions of the pixel electrode layers in a plan view of the substrate; and
disposing, higher than the pixel electrode layers, a plurality of row light-shielding layers extending in the row direction, arranged side-by-side in the column direction, overlapping the column-direction edge portions of the pixel electrode layers and partially overlapping contact regions of the pixel electrode layers in the plan view of the substrate.

* * * * *